(12) United States Patent
Peythieux et al.

(10) Patent No.: US 12,061,786 B2
(45) Date of Patent: Aug. 13, 2024

(54) SETTING TYPED PARAMETER

(71) Applicant: DASSAULT SYSTEMES, Vélizy-Villacoublay (FR)

(72) Inventors: Laura Peythieux, Aix-en-Provence (FR); Frédéric Letzelter, Vélizy-Villacoublay (FR); Christophe Boyer, Aix-en-Provence (FR)

(73) Assignee: DASSAULT SYSTEMES, Vélizy-villacoublay (FR)

( * ) Notice: Subject to any disclaimer, the term of this patent is extended or adjusted under 35 U.S.C. 154(b) by 0 days.

(21) Appl. No.: 18/086,359

(22) Filed: Dec. 21, 2022

(65) Prior Publication Data
US 2023/0195296 A1 Jun. 22, 2023

(30) Foreign Application Priority Data

Dec. 21, 2021 (EP) ..................................... 21306895

(51) Int. Cl.
*G06F 3/04847* (2022.01)
*G06F 3/04815* (2022.01)

(52) U.S. Cl.
CPC ...... *G06F 3/04847* (2013.01); *G06F 3/04815* (2013.01)

(58) Field of Classification Search
CPC .............................. G06F 30/10; G06F 3/04847
See application file for complete search history.

(56) References Cited

U.S. PATENT DOCUMENTS

| | | | | |
|---|---|---|---|---|
| 5,450,540 A | * | 9/1995 | Spohrer | G06F 3/04847 715/837 |
| 6,061,067 A | * | 5/2000 | Silva | G06T 13/20 345/619 |
| 6,728,421 B2 | * | 4/2004 | Kokemohr | G06T 11/001 382/284 |
| 7,954,067 B2 | * | 5/2011 | Breglio | G06F 3/048 715/833 |
| 10,025,884 B1 | * | 7/2018 | Samah | G06F 30/23 |

(Continued)

OTHER PUBLICATIONS

"Grabowski, BricsCAD for AutoCAD Users V20, 2019, upFront. eZine Publishing, pp. 1-366" (Year: 2019).*

(Continued)

*Primary Examiner* — Ryan F Pitaro
(74) *Attorney, Agent, or Firm* — Oblon, McClelland, Maier & Neustadt, L.L.P.

(57) ABSTRACT

A computer-implemented method for setting a typed parameter of a typed operation applied to a 3D modeled object in a 3D scene. The method comprises displaying a representation of the 3D modeled object in the 3D scene. The method comprises obtaining the typed operation to be applied on a point of interest of the displayed representation of the 3D modeled object and selecting a first typed parameter among at least two typed parameters, thereby defining the selected first typed parameter as a current selected typed parameter. The method comprises providing a 2D manipulator in the 3D scene for setting the current selected typed parameter and setting the current selected typed parameter upon user interaction with at least one logical area of the 2D manipulator associated with the current selected typed parameters. The method improves the setting of a typed parameter of a typed operation.

20 Claims, 18 Drawing Sheets

(56) References Cited

U.S. PATENT DOCUMENTS

| | | | |
|---|---|---|---|
| 10,169,493 B2 * | 1/2019 | Clarysse | G06F 30/00 |
| 11,010,499 B2 * | 5/2021 | De Backer | G06F 3/04842 |
| 11,675,473 B1 * | 6/2023 | Breeden | G06F 3/0481 |
| | | | 715/738 |
| 2007/0294634 A1 * | 12/2007 | Kokemohr | G06F 3/04845 |
| | | | 715/781 |
| 2013/0227493 A1 | 8/2013 | Schmidt | |
| 2015/0253957 A1 | 9/2015 | Crocker | |
| 2018/0267690 A1 * | 9/2018 | Kemp | B25J 5/007 |

OTHER PUBLICATIONS

"Grabowski Inside BricsCAD v20, 2019, upFront.eZine Publishing, pp. 1-386" (Year: 2019).*

Extended European Search Report issued Jun. 21, 2022, in European Patent Application No. 21306895.0 filed Dec. 21, 2021, 11 pages.

Zentek Consultants: "Fast Manipulation of CAD Objects", Jun. 5, 2020 (Jun. 5, 2020), XP055929304, Retrieved from the Internet: URL:https://www.youtube.com/watch?v=9Tuz3f1DcdY, [retrieved on Jun. 9, 2022] * the whole document *, 2 total pages.

Dassault Systems, CATIA Imagine & Shape, https://www.3ds.com/products-services/catia/products/v5/portfolio/domain/Shape_Design_Styling/product/IMA/#:~:text=CATIA%20%2D%20Imagine%20%26%20Shape%202%20(IMA)%20breaks%20the%20traditional.a%20shape%20through%20a%20meshing_2002-2022, 7 total pages.

Dassault Systems, CATIA Natural Sketch, https://blogs.3ds.com/perspectives/tag/catia-natural-sketch/, 2002-2022, 5 total pages.

* cited by examiner

… … …

SETTING TYPED PARAMETER

CROSS-REFERENCE TO RELATED APPLICATIONS

This application claims priority under 35 U.S.C. § 119 or 365 to European Application No. 21306895.0, filed Dec. 21, 2021. The entire contents of the above application are incorporated herein by reference.

TECHNICAL FIELD

The disclosure relates to the field of computer programs and systems, and more specifically to a method, system and program for setting a typed parameter of a typed operation applied to a 3D modeled object in a 3D scene.

BACKGROUND

A number of systems and programs are offered on the market for the design, the engineering and the manufacturing of objects. CAD is an acronym for Computer-Aided Design, e.g., it relates to software solutions for designing an object. CAE is an acronym for Computer-Aided Engineering, e.g., it relates to software solutions for simulating the physical behavior of a future product. CAM is an acronym for Computer-Aided Manufacturing, e.g., it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Existing solutions for setting a typed parameter of a typed operation are not efficient. Indeed, the user needs to perform numerous clicks, spends a lot of time to make changes and performs large mouse distances.

A first existing solution is illustrated in reference to FIG. 1. The following sequence of user interactions is required in order to perform a first modification of the number of cuts of an edge of a 3D patch and a second modification of the dimension of the 3D patch in the direction of the edge. Firstly, the user needs to enter in a cut command to perform the first modification (i.e., relative to the number of cuts). The user enters in the cut command by performing a first click on a first icon 110, e.g., using a pointing device such as a mouse. Then, the user needs to select the edge 120 of the 3D patch 130 to be modified, e.g., with a second click on the edge 120. At this time, the user changes the number of cuts using a displayed slider 140, e.g., by pressing, dragging and releasing the pointing device on the slider 140. Secondly, the user needs to switch to a modification command in order to perform the second modification (i.e., relative to the dimension of the 3D patch in the direction of the edge), e.g., by clicking on a second icon 150 or by performing a first keyboard shortcut. Then, the user needs to select an "edge" mode, by clicking on a third icon 150 or by performing a second keyboard shortcut. At this time, the user needs to select each edge of the 3D patch that is concerned by the modification (i.e., by performing four clicks or two clicks and a third keyboard shortcut for propagation). Finally, the user performs the modification of the dimension of the 3D patch by translating 160 the selected edges (i.e., by pressing, dragging and releasing the pointing device). Thus, for performing the first modification and the second modification, the user needs to perform a total of nine interactions, which is therefore not ergonomic, not efficient and time consuming for the user.

A second existing solution is illustrated in reference to FIG. 2. The following sequence of user interactions is required in order to perform an edge extrusion operation. Firstly, the user needs to launch the extrusion command and set right settings by performing from one to three clicks on a set of displayed icons 210. Then, the user needs to select the edge 220 to be extruded (using one click). After the selection, the user drags in empty space 230 to modify the length of the edge by pressing, dragging and releasing the pointing device. Secondly, the user needs to launch the angle slider and modify the angle of the extrusion by user interacting with a displayed slider 240 (by pressing, dragging and releasing the pointing device). Thus, the user has to go to the slider to manipulate the angle because the area near the extrusion is already used to perform the modification of the length. It causes mainly three problems.

These existing solutions have several drawbacks. A first one is that the slider hides a part of the 3D scene in which the 3D patch is displayed because of its size. Thus, the performing of the edge extrusion reduces the visibility of the 3D scene. A second drawback is that the movement of the pointing device during the modification is not efficient. Indeed, the user performs an additional movement of the pointing device to switch from the first modification to the second modification (e.g., a movement over the slider to modify the angle). Moreover, this additional movement breaks the workflow for the user, as he/she has to divert his/her attention from the 3D patch to the slider before performing the angle modification. A third drawback is that the user's cursor is "far" from the edge of the 3D patch that is being modified. The user cannot look closely simultaneously the cursor and the edge that is currently modified: indeed the distance between the cursor and the edge is too large (the distance on the screen wherein the cursor and the edge are displayed). At least one of these two elements (the cursor or the edge) is seen by the user with their peripheral vision. Thus, the user modification loses accuracy and the user may have to manipulate the slider several times to reach the right value. Furthermore, the value of the angle and the 3D patch that is being modified are displayed on different parts of the screen (the right of the screen for the slider and the center for the manipulated 3D patch in the second example scenario). Therefore, the user has to make his/her attention go back and forth to iterate on both, which leads to eye and muscle fatigue.

Other existing solutions are based on a principle of logical areas. In these solutions, logical areas each associated with a respective operation are provided in the 3D scene (each logical area being provided in a respective location of the 3D scene). The user may thus move the mouse successively on different locations belonging to different logical areas for setting the parameters of the different operations associated with each of these different logical areas. However, meaningful locations are the same for the different parameters and the number of operations associated with a respective logical area is therefore limited. Indeed, logical areas associated with different operations must be distinct. A solution would be to provide a modifier to switch between the operations. However, firstly, a modifier would be hidden and by so cannot be the only way to perform an action. It would then be necessary to have another way to switch between the parameters of a given operation. Secondly, it implies to choose a main parameter and a hidden one, which is not suitable in most cases.

Within this context, there is still a need for an improved solution for setting a typed parameter of a typed operation.

SUMMARY

It is therefore provided a computer-implemented method for setting a typed parameter of a typed operation applied to a 3D modeled object in a 3D scene. The method comprises displaying a representation of the 3D modeled object in the 3D scene. The method comprises obtaining the typed operation to be applied on a point of interest of the displayed representation of the 3D modeled object. The typed operation comprises at least two typed parameters. The method comprises selecting a first typed parameter among the at least two typed parameters, thereby defining the selected first typed parameter as a current selected typed parameter. The method comprises providing a 2D manipulator in the 3D scene for setting the current selected typed parameter. The 2D manipulator comprises at least one logical area associated with each of the at least two typed parameters. A logical area is a 2D surface in the 3D scene on which a user interaction can be performed for setting the typed parameter associated with. The method comprises displaying a graphical representation of a 2D manipulator in the 3D scene for setting the current selected typed parameter. The method comprises setting the current selected typed parameter upon user interaction with the at least one logical area of the 2D manipulator associated with the current selected typed parameters.

The method may comprise one or more of the following:
the method may further comprise:
  selecting a second typed parameter among the at least two typed parameters, thereby defining the selected second typed parameter as the current selected typed parameter;
  displaying a new graphical representation of the 2D manipulator in the 3D scene for setting the current selected typed parameter; and
  setting the current selected typed parameter upon user interaction with the at least one logical area of the 2D manipulator associated with the current selected typed parameter;
the graphical representation of the 2D manipulator may comprise a first circular element belonging to the 2D surface of the at least one logical area of the 2D manipulator associated with the second typed parameter;
the graphical representation of the 2D manipulator may comprise a second circular element belonging to the 2D surface of the at least one logical area of the 2D manipulator associated with the selected first typed parameters;
the first and second circular elements may be concentric one of each other's and have each a respective radius;
at least one of the first and second circular elements may be a slider;
at least one of the first and second circular elements may comprise two triangles that orient themselves to indicate a direction of modification;
the displaying of the graphical representation may further comprise:
  displaying a current value of the current selected typed parameter, the displayed current value being displayed substantially centered in the graphical representation of the 2D manipulator; and
  updating in real time the displayed current value while setting of the current selected typed parameter;
the obtaining of the typed operation to be applied on the point of interest may comprise:
  detecting a user interaction on a geometry of the 3D modeled object; and
  if the geometry on which the user interaction is detected is a vertex, selecting the vertex as the point of interest; or
  if the geometry on which the user interaction is detected is an edge, selecting a barycenter of the edge as the point of interest;
the displaying the graphical representation may further comprise displaying a link graphically connecting the graphical representation of the 2D manipulator and the point of interest;
the setting of the current selected typed parameter may comprise:
  detecting a user interaction on one of logical area associated with the current selected typed parameter;
  determining a new value of the current selected typed parameter based on the value of the current selected typed parameter and the detected user interaction;
  applying the typed operation to the 3D modeled object based on the new value of the current selected typed parameter;
  updating the representation of the 3D modeled object based on the applied typed operation and updating a position of the 2D manipulator according to the updated representation of the 3D modeled object;
the updating of the position of the 2D manipulator may comprise:
  keeping the 2D manipulator in a plane perpendicular to a point of view of the user on the 3D scene; and/or
  keeping constant a distance in the 3D scene between the 2D manipulator and the point of interest;
the setting of the current selected typed parameter may comprise displaying at least one line representing a set of possible positions of the point of interest, each possible position of the set corresponding to a value of the current selected typed parameter;
the 2D manipulator may further comprise, for at least one of the at least two typed parameters, at least one additional logical area. Each additional logical area may be a respective 2D surface embedded in the 3D scene;
the setting of the current selected typed parameter may comprise setting the current selected typed parameter upon user interaction with the at least one additional logical area of the 2D manipulator associated with the current selected typed parameters;
the 2D manipulator may further comprise, for at least one of the at least two typed parameters, at least one additional logical area. Each additional logical area may be a respective 2D surface embedded in the 3D scene;

the setting of the current selected typed parameter may comprise setting the current selected typed parameter upon user interaction with the at least one additional logical area of the 2D manipulator associated with the current selected typed parameters;

the typed operation may be an edition. The 3D modeled object may comprise an edge. The at least two typed parameters may comprise a number of cuts of the edge and a length of the 3D modeled object in a direction perpendicular to the edge;

the typed operation may be an extrusion. The at least two typed parameters may comprise a length of extrusion and a rotation of extrusion; and/or the typed operation may be a pattern. The at least two typed parameters may comprise a pattern design and a pattern density.

It is further provided a computer program comprising instructions for performing the method.

It is further provided a computer readable storage medium having recorded thereon the computer program.

It is further provided a system comprising a processor coupled to a memory and a graphical user interface, the memory having recorded thereon the computer program.

BRIEF DESCRIPTION OF THE DRAWINGS

Non-limiting examples will now be described in reference to the accompanying drawings, where.

DETAILED DESCRIPTION

Figure 3:
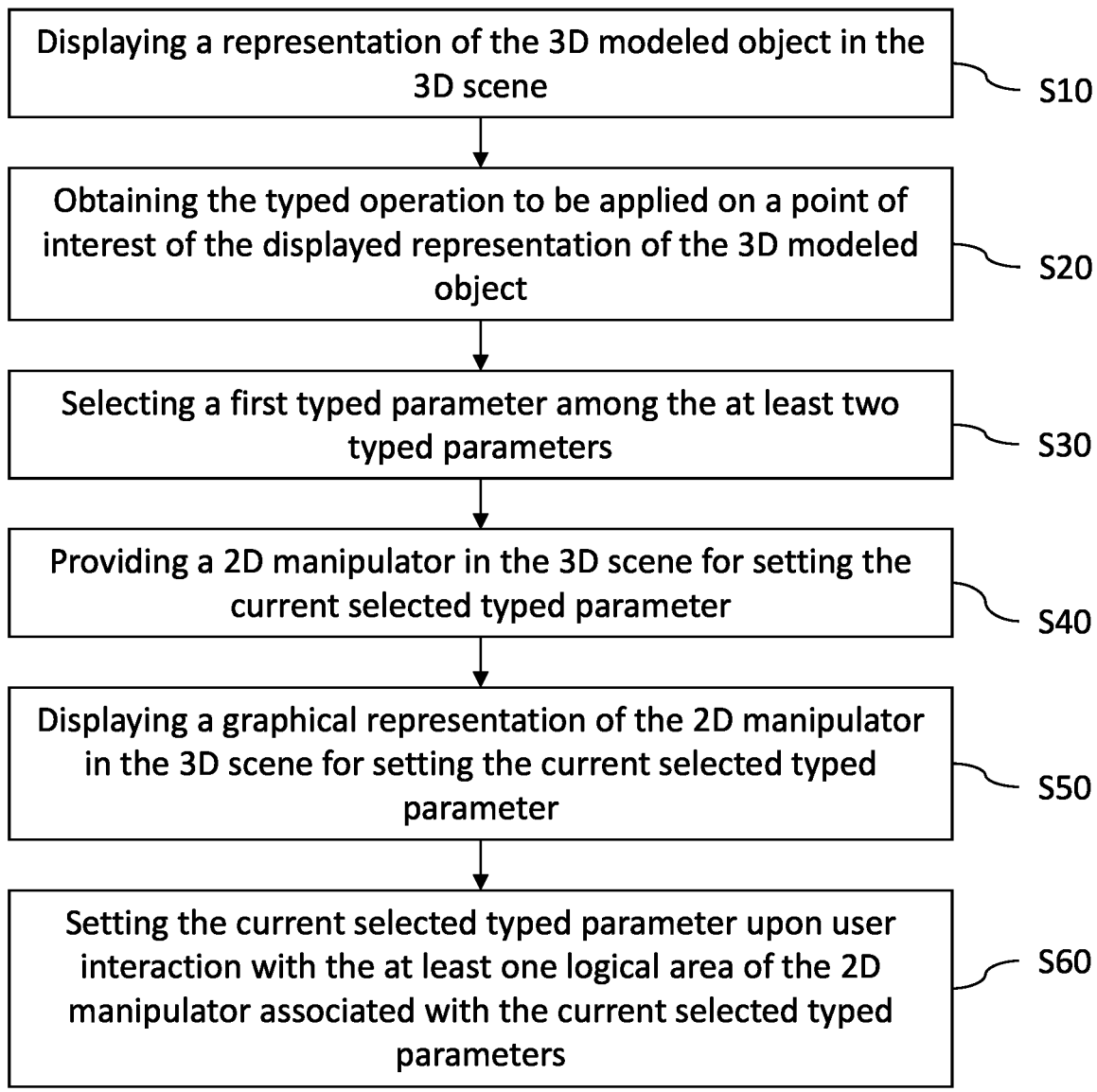
FIG. 3 shows a flowchart of an example of the method.

With reference to the flowchart of FIG. 3, there is described a computer-implemented method for setting a typed parameter of a typed operation applied to a 3D modeled object in a 3D scene. The method comprises displaying S10 a representation of the 3D modeled object in the 3D scene. The method comprises obtaining S20 the typed operation to be applied on a point of interest of the displayed representation of the 3D modeled object. The typed operation comprises at least two typed parameters. The method comprises selecting S30 a first typed parameter among the at least two typed parameters, thereby defining the selected first typed parameter as a current selected typed parameter. The method comprises providing S40 a 2D manipulator in the 3D scene for setting the current selected typed parameter. The 2D manipulator comprises at least one logical area associated with each of the at least two typed parameters. A logical area is a 2D surface in the 3D scene on which a user interaction can be performed for setting the typed parameter associated with. The method comprises displaying S50 a graphical representation of a 2D manipulator in the 3D scene for setting the current selected typed parameter. The method comprises setting S60 the current selected typed parameter upon user interaction with the at least one logical area of the 2D manipulator associated with the current selected typed parameters.

Such a method forms an improved solution for setting a typed parameter among at least two typed parameters.

Notably, the method improves the efficiency, the productivity and the usability of the setting of a typed parameter among at least two typed parameters. Indeed, the provided 2D manipulator comprises a respective logical area for setting each typed parameter, which allows achieving a particularly efficient setting of each parameter. Upon user interaction with the 2D manipulator, the user designing the 3D modeled object (e.g., the engineer working on a product to be manufactured) can set each of the typed parameters. The productivity is improved because the 2D manipulator brings proximity between user interactions to define each typed parameter, which increases the speed at which the user accomplishes the typed operation. The proximity provided by the 2D manipulator is particularly relevant for typed parameters because they each belongs to the same typed operation, which implies that typed parameters are prone to be set during a same procedure, i.e., successively in a same period of time. This makes the usability of the method particularly high because the 2D manipulator allows gathering in a same space and in close proximity the user interactions to set the typed parameters of a same typed operation. The setting of a typed parameter among at least two typed parameters is therefore particularly ergonomic.

Moreover, the method is also efficient because the user is guided in the setting of one of the typed parameters. Indeed, after the selection of a first typed parameter, a graphical representation for setting this current selected typed parameter is displayed. Thus, the display of the 2D manipulator is adapted according to the typed parameter that is currently selected, i.e., the one among the at least two typed parameters of the typed operation that is currently set. This also contributes to the improvement of the ergonomics.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g., one for the program, and possibly one for the database).

The method generally manipulates modeled objects. A modeled object is any object defined by data stored e.g., in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g., non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g., representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e., increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electromechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

A CAD system may be history-based. In this case, a modeled object is further defined by data comprising a history of geometrical features. A modeled object may indeed be designed by a physical person (i.e., the designer/user) using standard modeling features (e.g., extrude, revolute, cut, and/or round) and/or standard surfacing features (e.g., sweep, blend, loft, fill, deform, and/or smoothing). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object is described by two persistent data representations: history and B-rep (i.e., boundary representation). The B-rep is the result of the computations defined in the history. The shape of the part displayed on the screen of the computer when the modeled object is represented is (e.g., a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE solution, it is additionally meant any solution, software of hardware, adapted for the analysis of the physical behavior of a modeled object. A well-known and widely used CAE technique is the Finite Element Method (FEM) which typically involves a division of a modeled object into elements which physical behaviors can be computed and simulated through equations. Such CAE solutions are provided by Dassault Systèmes under the trademark SIMULIA®. Another growing CAE technique involves the modeling and analysis of complex systems composed of a plurality of components from different fields of physics without CAD geometry data. CAE solutions allow the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people, and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Figure 4:
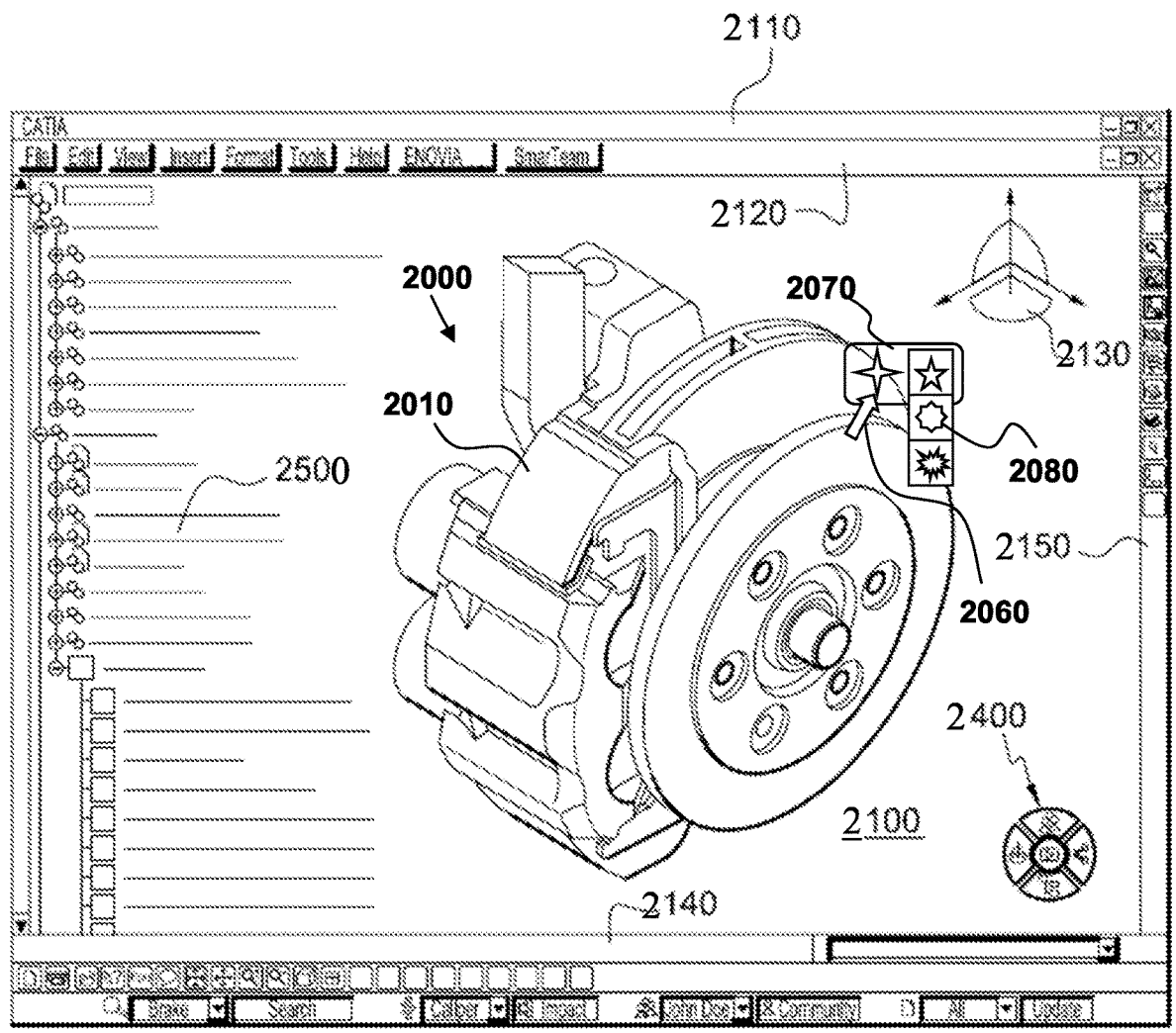
FIG. 4 shows an example of a graphical user interface of the system.

FIG. 4 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g., change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 5:
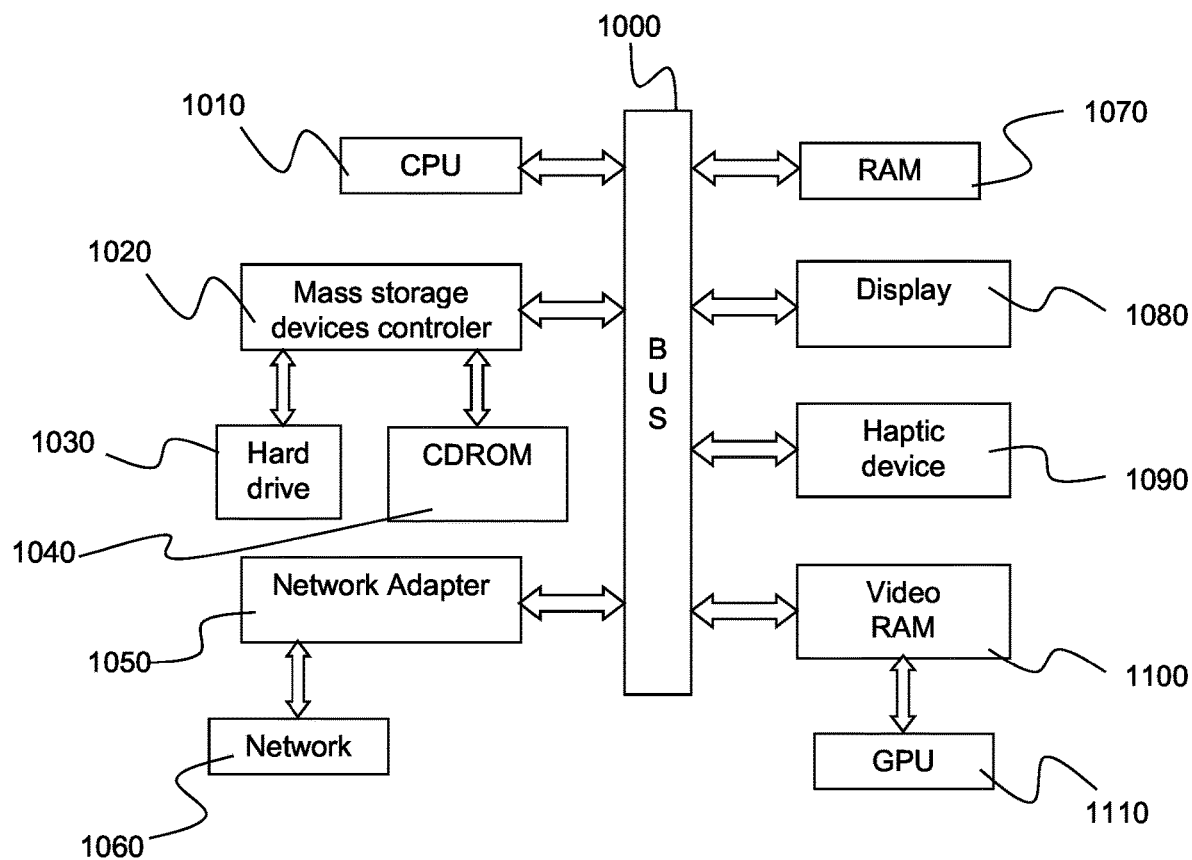
FIG. 5 shows an example of a system.

FIG. 5 shows an example of the system, wherein the system is a client computer system, e.g., a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding to the modeled object. In any case, the modeled object designed by the method may represent a manufacturing object. The modeled object may thus be a modeled solid (i.e., a modeled object that represents a solid). The manufacturing object may be a product, such as a part, or an assembly of parts. Because the method improves the design of the modeled object, the method also improves the manufacturing of a product and thus increases productivity of the manufacturing process.

Referring back to the flowchart of FIG. 3, the computer-implemented method is now discussed in more details.

The method comprises displaying S10 a representation of the 3D modeled object in the 3D scene. The display is made e.g., but not limited to, on a computer screen, a touch pad or virtual reality glasses. The representation of the 3D modeled object may comprise one or more edges, lines, faces and/or surfaces each representing a respective portion of the geometry of a product to be manufactured. The displaying may comprise visually displaying these edges, lines, faces or surfaces to the user (e.g., on the computer screen, the touch pad or virtual reality glasses in a graphical user interface such as that show in FIG. 4). The 3D modeled object may be represented as a mesh comprising edges and/or vertex of the mesh, and the displaying may comprises visually displaying the edges and/or vertex of the mesh to the user.

The representation of the 3D modeled object is displayed in the 3D scene. This means that the representation of the 3D modeled object may be displayed in relation to other objects of the 3D scene (e.g., representations of other 3D modeled objects of the 3D scene), i.e. positioned relatively to these other objects. These other objects may already be displayed at the time the representation of the 3D object is displayed, or they may be displayed at the same time, or they may be displayed after that the displaying of the representation of the 3D modeled object in the 3D scene has been performed. The 3D scene and the objects thereon may be displayed on a graphical user interface (GUI), such as the one discussed with reference to FIG. 4.

A typed operation is an operation that is completely defined by (or said otherwise, only defined by) a set of typed parameters. The typed operation may be defined as a function taking as input the set of typed parameters and instantiating (or creating) an output according to the typed operation and the set of typed parameters. The output of the instantiation of a given typed operation on the 3D modeled object may be certain and only made possible if each of the typed parameters has been set (i.e., for the given typed operation, but the output may differ for another typed operation). The output of the instantiation may depend (i.e., may be different) depending on the typed operation. For example, for a same set of typed parameters, the output of the instantiation of a first typed operation may defer from the output of the instantiation of a second typed operation if the first typed operation differs from the second typed operation. Examples of typed operations include a creation of a sphere and, in that case, the set of typed parameters of this typed operation may comprise a location of a center for the sphere and a radius of the sphere. The typed operation corresponding to the creation of a sphere takes as input these two typed parameters ("center location" and "radius") and returns a sphere as the topology of the sphere is completely defined by the typed parameter "center location" and the typed parameter "radius". A result of the instantiation of a typed operation is known when each of the typed parameters are set, whatever the typed operation is. A typed operation is therefore one in which each typed parameters is predefined as part of the typed operation and each parameter of the typed operation is described with a type. The type of all parameters is known before the instantiation time of the operation (i.e., the time during which the typed operation is effectively instantiated and computed, and the 3D modeled object as modified by the application of the typed operation is stored in the memory).

In examples, the typed operation may comprise several typed sub-operations, and each typed sub-operation may take as input the set of typed parameters (i.e., a same set of typed parameters which is the set of typed parameters that is set). The application of the typed operation may comprise applying one or more (e.g., each) of these several typed sub-operations to the 3D modeled object. In these examples, the method therefore allows setting a same set of typed parameters for several typed sub-operations at the same time.

A typed parameter is a parameter that is characterized by features specific to its type. Examples of types of parameters may be numerical, text, date, Boolean or object. The type of a parameter represents its nature, i.e., its intrinsic properties. It defines the set of values that the typed parameter can take. For instance, the set of values that the typed parameter can take may be an interval of continuous numerical values or a set of discrete values, or a list of strings or discrete values (such as "True" or "False" when the parameter is a Boolean).

A typed operation is applied to the 3D modeled object. This means that the instantiation of the typed operation modifies the 3D modeled object in the 3D scene and may modify the geometry of the product to be manufactured represented by the 3D modeled object represents. For instance, each typed parameter may be associated to a feature of the geometrical modification of the product. For instance, the typed operation may be an extrusion and one of the typed parameters may be a length of extrusion. The application of the typed operation to a 3D modeled object may result in an extrusion of the 3D modeled object according to the length of extrusion that has been set. In other examples, the typed operation may be an edition. For instance, the instantiation of the edition may result in a modification of a number of cuts of an edge of the 3D modeled object and a modification of a length of the 3D modeled object in a direction perpendicular to the edge. In that case, the typed parameters may comprise a typed parameter representing the number of cuts and another typed parameter representing the length of the 3D modeled object. In other examples, the typed operation may be a revolution, a translation, a creation of fillets or chamfers or a shell transformation.

In examples, the result of the application of the typed operation to the 3D modeled object may be a multiplication of the 3D modeled object in the 3D scene. For instance, the typed operation may be a pattern and the modification may consist in creating new instances of the 3D modeled object according to the pattern, i.e., repeating the 3D modeled object in the 3D scene according to the pattern. In that case, the typed parameters may include a pattern design (e.g., linear or circular) and a density representing the number of instances of the 3D modeled object.

The typed operation is applied on a point of interest of the displayed representation of the 3D modeled object. This means that the modification caused by the application of the typed operation is centered on and/or directed to the point of interest. The application of the typed operation may modify the 3D modeled object at the location of the point of interest. For instance, application of the typed operation may modify the one or more elements of the 3D modeled object (i.e., the vertex, the edges or the faces of the 3D modeled object) that are, from a geometrical point of view, in contact with (or that include) the point of interest, or that are part of the elements that border these one or more elements in contact with the point of interest. The point of interest may be a point that belongs to the 3D modeled object. The point of interest may be a point on a vertex, an edge or a face of the 3D modeled object. For instance, when the geometry is a vertex, the point of interest may be the vertex itself. In other examples, the point of interest may be the barycenter of the geometry. For instance, if the typed operation is an edition, the point of interest may be the barycenter of the edge to be edited. In other examples, the point of interest may be a point on the boundary of the geometry. For instance, if the typed operation is an extrusion, the point of interest may be the barycenter of the face to be extruded. In other examples, the point of interest may be the barycenter of 3D modeled object itself (e.g., in the case) or a portion of the 3D modeled object. For instance, if the typed operation is a pattern, the point of interest may be the barycenter of the 3D modeled object (or its portion) to be multiplied.

The obtaining S20 of the typed operation may be performed upon user interaction. For instance, the obtaining S20 of the typed operation may comprise displaying a set of icons each associated with a respective typed operation and selecting, upon user interaction with a given icon of the displayed set, the typed operation associated with the given icon. In that case, the obtained typed operation may be the selected typed operation.

Alternatively or additionally, the obtaining S20 of the typed operation may be performed automatically. Examples are now discussed.

In examples, a list of typed operations may be stored in a memory, and one of the typed operations of the list may be automatically selected. In that case, the typed operation of the list that is automatically selected may be predetermined and/or set according to user preferences, e.g., based on the 3D modeled object, the displayed representation of the 3D modeled object and/or the point of interest of the displayed representation.

In examples, the method may determine the typed operation to be applied according to the point of interest (e.g., an edition when the point of interest belongs to an edge or an extrusion when the point of interest belongs to a surface). In these examples, the method may comprise selecting a point of interest of the 3D modeled object (e.g., upon user interaction on a geometrical element of the 3D modeled object) and automatically determining the typed operation to be applied based on the selected point of interest. In the event several typed operations might be applied (as a result of the automatic selection) to the selected point of interest, the method may invite the user to select one of them (e.g., using a display of a set of icon as previously discussed), or may automatically select the one that is registered as a default typed operation.

In examples, the obtaining S20 of the typed operation may be repeated; several consecutive obtaining steps are carried out according to at least one of the discussed examples. For instance, the method may comprise selecting a new typed operation to be applied on the point of interest of the displayed representation of the 3D modeled object (e.g., upon user interaction on a new displayed icon as previously discussed). Alternatively, the method may comprise detecting a selection of a new point of interest of the 3D modeled object and automatically determining a new typed operation according to the selected new point of interest. After the selecting of the new typed operation, the method may comprise repeating the steps of selecting S30 a first typed parameter, providing S40 a 2D manipulator, displaying S50 a graphical representation and setting S60 the current selected typed parameter with the selected new typed operation. This allows an efficient instantiation of several typed operations.

The method comprises selecting S30 the first typed parameter among the at least two typed parameters. The selecting S30 of the first typed parameter may be performed upon user interaction. For instance, the method may comprise detecting a first user interaction with a first logical area of the 2D manipulator and selecting the typed parameter associated with the first logical area. In that case, the method may provide the 2D manipulator before that the first typed parameter is selected. Alternatively, the selecting S30 of the first typed parameter may be performed automatically. For instance, one of the typed parameters may be registered as a default typed parameter and may be selected first after that the 2D manipulator is provided. In that case also, the 2D manipulator may be provided before that the first typed parameter is selected: the method defines the selected first typed parameter as a current selected typed parameter. For instance, each typed parameters may be registered at a respective address in a memory and the method may store in the memory that the current selected typed parameters is the one that is at the address of the first typed parameter.

The method comprises providing S40 the 2D manipulator in the 3D scene for setting the current selected typed parameter. The manipulator is a tool for the user in the design of the 3D modeled object. The 2D manipulator comprises at least one logical area that the user may interact with to set the typed parameters. The manipulator is "2D" because it comprises logical areas that are each a respective 2D surface in the 3D scene.

The at least one logical area are associated with each of the at least two typed parameters. This means that each of the typed parameter is associated with one of the at least one logical area that the 2D manipulator comprises (or may be associated with several logical areas when the 2D manipulator comprises more than one logical area). In other words, each typed parameter is associated with at least one of the logical area(s) of the 2D manipulator. Each logical area may be associated with one of the at least two typed parameters. For instance, the 2D manipulator may comprise a single logical area for each of the typed parameters. In that case, the 2D manipulator thus comprises two or more logical area (one for each typed parameter). In other examples, the 2D manipulator may comprise, for one or more typed parameters of the at least two typed parameters (e.g., all), several logical areas associated with each of the one or more of the typed parameters. For instance, the typed operations may comprise two typed parameters (a first and a second typed parameter), and the 2D manipulator may comprise a single logical area for the first typed parameter and two logical areas for the second. Thus, one or more logical areas may be associated to each typed parameter, and, for each typed parameter, the number of associated logical area may be the same as the other typed parameter or may vary depending on the typed parameter.

A logical area is a 2D surface in the 3D scene on which a user interaction can be performed for setting the typed parameter associated with. The 2D surface is defined and limited in space in the 3D scene. This means that the 2D surface corresponds to a limited portion of the 3D scene. Each point of the 2D surface corresponds to a point of the 3D scene.

The providing S40 of the 2D manipulator may comprise registering each of the points of the 3D scene that corresponds to a logical area associated with a typed parameter and detecting, in real-time, if a user interaction is performed on one of these registered points of the 3D scene. Detecting in real-time means that interactions of the user may be monitored and thus the detection may be immediate after the performing of the user interaction (or after a short time). When a user interaction is detected, the method may comprise determining the typed parameter that is associated to the point of the 3D scene on which the user interaction is detected and setting S60 the determined typed parameter according to the detected user interaction.

The method comprises displaying S50 a graphical representation of the 2D manipulator in the 3D scene for setting the current selected typed parameter. The graphical representation may comprise graphical elements each representing a respective information about the 2D manipulator. For instance, the graphical representation may comprise one or more graphical elements that represent a logical area of the 2D manipulator, e.g., one or more graphical elements having a shape that matches the 2D surface of the logical area. Each graphical element may belong to (or intersect with) the 2D surface. This means that a portion of the graphical element may be in the space between the limits of the 2D surface. Displaying S50 the graphical representation may comprise displaying one or more of the graphical elements of the graphical representation, e.g., the graphical element representing a logical area that is associated with the currently selected parameter. The graphical representation may be displayed with the representation of the 3D modeled object, e.g., on a same window of the GUI. For instance, the graphical representation may be displayed above the representation of the 3D modeled object.

Figure 1:
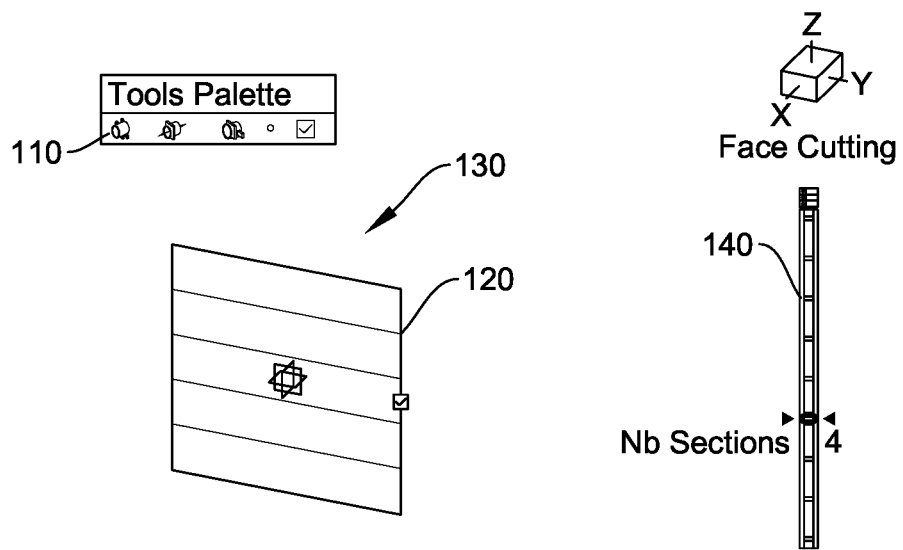
FIGS. 1 and 2 show two examples of prior art methods.
Figure 1:
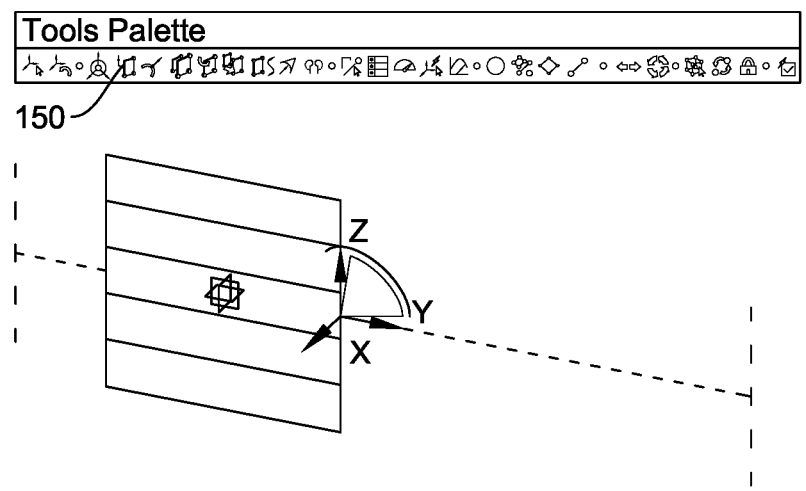
Figure 1:
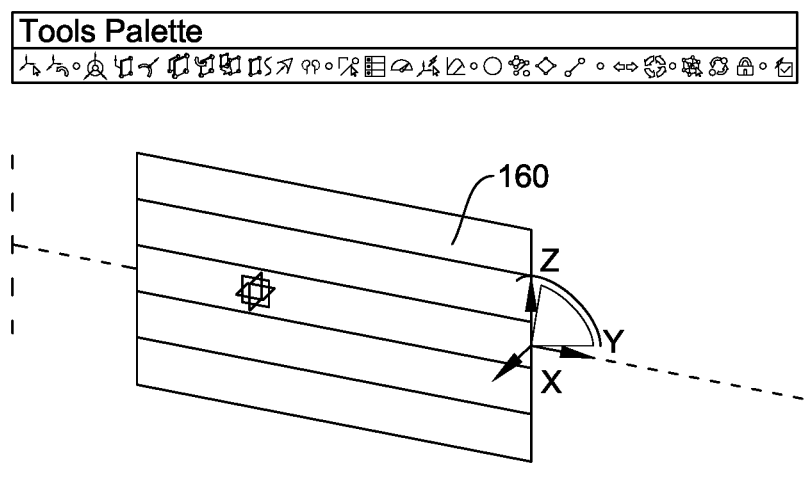
Figure 2:
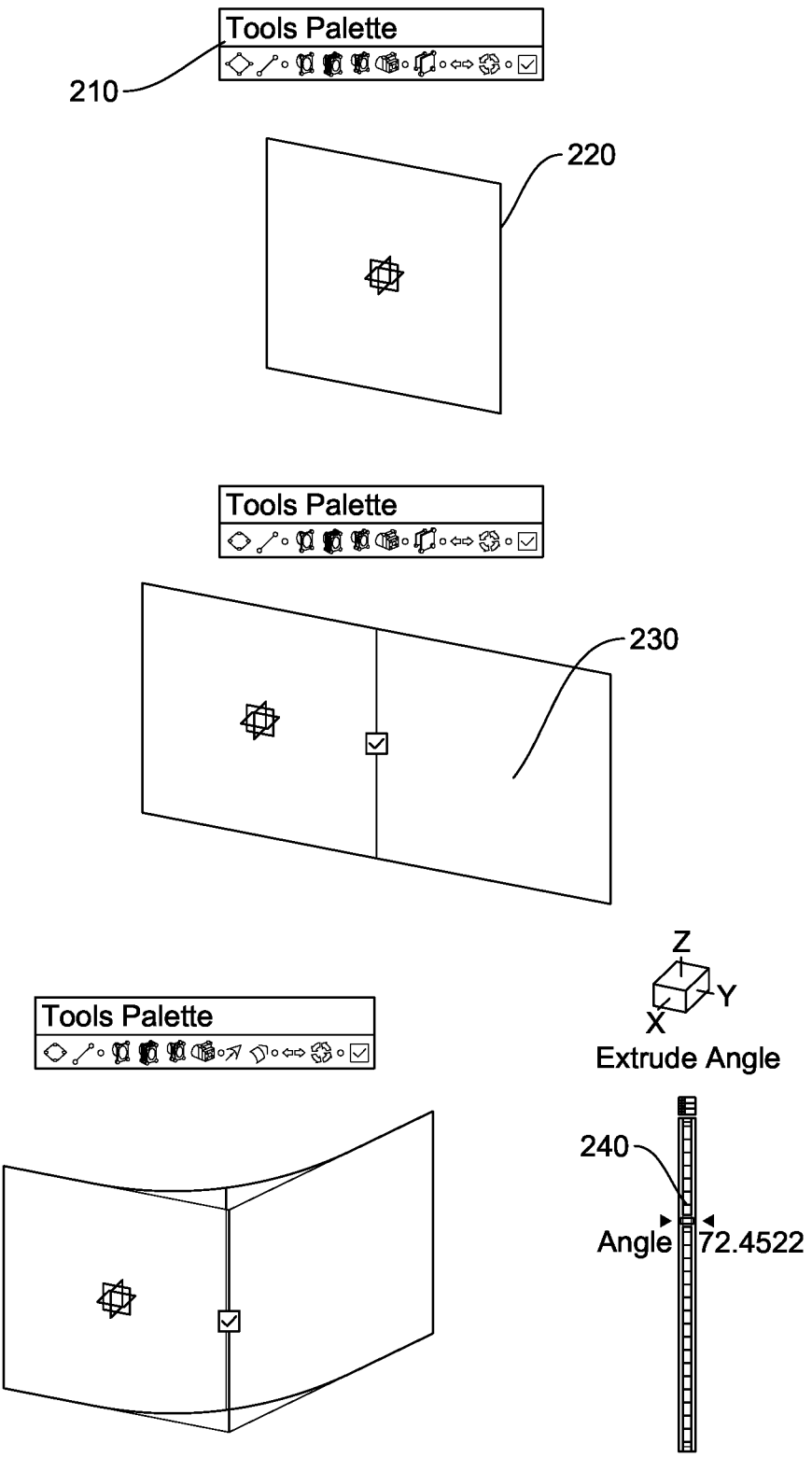

The setting S60 of the current selected typed parameter upon user interaction is now discussed. In the flowchart of FIG. 1, the current select typed parameter is the first typed parameter, and at step S60, the first typed parameter is thus set, but this discussion applies also to the setting of any typed parameter that is currently selected (e.g., the second, third and/or fourth typed parameter).

Setting the current selected typed parameter means registering/storing a new value for the current selected typed parameter (e.g., in the memory); the current selected typed parameter is associated with a first value before the setting and, after the setting, with a second value (the new one). Thus, the second value replaces the first one, the replacement being the consequence of the user's interaction. In examples, the setting of the current selected typed parameter may be continuous along with the user interaction. In other examples, the current selected typed parameter may be set only at the end of the user interaction.

The user interaction may be of any kind and may be performed with any type of pointing device (e.g., such as a mouse controlling a cursor represented in the 3D scene) or with an appendage (e.g. such as a finger or a stylet) substantially in contact with a touch screen.

In examples, the user interaction may be a press and release interaction. A press and release interaction comprises a press in a first location of the 3D scene, a movement, and a release of the press after the movement in a second location of the 3D scene. For example, in the case the pointing device is a mouse controlling a cursor in the GUI, the press may be a press of one button of the mouse by the user, and the first location may be the location of the cursor in the GUI at that time of the pressing. The user interaction may then comprise a movement of the mouse controlled by the user resulting in a translation of the cursor in the GUI and the release may be a release of the button by the user after the movement. The second location may be the new location of the cursor in the GUI at that time of releasing (i.e., the position after the translation of the cursor resulting from the movement of the mouse). In the case where the user interaction is performed with an appendage, the user interaction may be a slide of the appendage across a touch screen (e.g., of a touch pad). The first location may be the location at the beginning of the slide (i.e., the first point of contact between the finger or stylet and the touch screen), the movement may be a movement of the appendage substantially in contact with the touch screen (i.e., a "slide"), and the second location may be the location at the end of the "slide" movement (i.e., when the appendage is away from the touch screen). Similarly, the user interaction may be any interaction that includes a movement performed by the user in the real-world between a first location and a second location (for example using a mouse two consecutive clicks between two locations or a mouse scroll).

In examples, the setting may comprise detecting that the first location of the press and release interaction is inside the logical area associated with the first typed parameter. Inside means that the first position is in the space between the limits of the 2D surface associated with the first typed parameter. Then, the setting S60 may comprise defining that the first typed parameter is the current selected typed parameter and setting S60 the current selected typed parameter according to the movement of the press and release interaction. As for the second location (i.e., the location at the time of the release), it may be inside or outside of the logical area, since what matters may be the movement between the first location and the second location, not the position of the second relative to the logical area. This means that the pointing device may remain in the logical area, or, alternatively, that the movement may direct the pointing device outside the logical area.

In examples, the user interaction for selecting S30 the first typed parameter may be a part of the user interaction for setting S60 the first typed parameter. The method may, after the detecting that the first location is inside the logical area associated with a given type parameter, automatically selects and defines the given typed parameter as the current selected typed parameter. The user may thus perform one single user interaction for performing both the selecting and the setting of a typed parameter, which is particularly efficient.

In examples, the method may set the value of the current selected typed parameter in real-time according to the movement (i.e., during the movement and continuously). For instance, the setting may comprise monitoring the movement of the user interaction and, at the same time, attributing a new value to the current selected typed parameter according to the movement as monitored (i.e., updating in real-time the value of the current selected typed parameter). For instance, a new value may be attributed when a variation of the movement becomes greater than a threshold, and the threshold may be selected such that the updating of the current selected typed parameter appears continuous to the user. In other examples, the updating of the current selected parameter may be performed only at the end of the user interaction. For instance, the setting S60 may comprise detecting the end of the user interaction and, only after that, attributing a new value to the current selected typed parameter according to the movement.

In examples, the setting may comprise computing the attributed new value based on the length of the movement (e.g., proportional to the length). The length of the movement may be the real length (for example the distance covered by the cursor), or a projected distance, for example along an axis. For instance, the axis may be an axis passing through the initial position of the cursor at the beginning of the interaction and the position of the cursor when a new value is attributed. The computing of the new value may also be based on the current value of the first typed parameter (i.e., before the setting). For instance, the computing of the new value may comprise computing a value change according to the movement (e.g., proportional to the length of the movement) and adding this value change to the current value, and the new value may be the result of this addition. Alternatively or additionally, the computing of the new value may be also based on the direction of the movement.

For instance, the direction may define the sign (i.e., positive or negative) of the value change.

The graphical representation of the 2D manipulator is now discussed.

The graphical representation may comprise one or more circular elements each belonging to the 2D surface of a respective logical area. This means that a portion of each circular element is in the space between the limits of the 2D surface of a respective logical area (e.g., of only one logical area or of several logical areas). For example, the circular element may intersect (cross) the 2D surface of one logical area (or several logical areas, e.g. associated to a same typed parameter). The circular element and the logical area may be in a same plane. A circular element may be a line forming substantially a circle (or a portion thereof) and a respective portion of the line may belong (e.g., traverse) to the 2D surface of the one or more logical areas (e.g., a different portion for each logical area). The logical area may be a 2D disk or a 2D circular surface (such as a circular crown). When the logical area is a 2D disk, the circular element may substantially traverse the 2D disk (e.g., pass through the substantially center). When the logical area is a 2D circular surface, the circular element may correspond to the center of the 2D circular surface (i.e., the circular element may be completely bordered by the 2D circular surface). The logical area may be a 2D disk or a circular surface (such as a circular crown) and the circular element may substantially traverse the 2D disk. correspond to the center of the 2D circular surface. The one or more circular elements may be concentric one of each other's and have each a respective radius. Each circular element may be centered (or substantially centered) on the 2D manipulator and may have a respective radius (i.e., a radius that differs from the radius of each other circular element). The circular element corresponding to the current selected typed parameter may be visually highlighted (e.g., may be of wider thickness) and/or each other circular element may be hidden (partially or totally) and/or may be of thinner thickness.

In a first example, a circular element may be a slider, which may comprise a cursor indicating the value of the typed parameter that is associated with the logical area of the circular element. In that case, the logical area may surround the cursor (e.g., may be a 2D disk substantially centered on the cursor). In a second example, a circular element may comprise two triangles that orient themselves to indicate a direction, such as a direction of modification (e.g., the modification of the typed operation when the typed parameter corresponding to the circular element is set). In that case, the 2D manipulator may comprise two logical areas associated with the typed parameter and each of the two logical areas may surround a respective cursor (e.g., may be a 2D disc substantially centered on one of the two cursors). The direction indicated by the two triangles may be a direction along an axis passing through the two triangles. The graphical representation of the 2D manipulator may comprise anyone (or any combination) of these first and second examples of circular elements.

The 2D manipulator allows selecting and setting a second typed parameter upon user action on a second logical area already available to the user via the displayed graphical representation (e.g., in the GUI). Moreover, the displayed graphical representation of the 2D manipulator is compact which allows the user to set quickly and efficiently each of the typed parameters. This improves ergonomics by reducing the number of user interactions for performing the setting and the effort required by the user to perform them (e.g., gain in mouse distance). The graphical representation is compact because several information is stacked in a same location at the same time thanks to the use of circular elements, in particular when the circular elements are concentric one of each other's. Moreover, displaying circular elements having each a different radius contributes to improve distinguishing them for the user. Furthermore, each circular element belongs to the 2D surface of one of the logical areas. This means that, for each circular element, a portion of the circular element may be in the space between the limits of the 2D surface of the logical areas. Thus, the circular element allows indicating the location of the logical area in the 3D scene. This improves the selection and the setting of typed parameters by reducing errors or handling mistakes. Indeed, it allows the user to known perfectly where the logical areas are in the 3D scene.

In examples, the method may further comprise selecting a second typed parameter among the at least two typed parameters. The selecting of the second typed parameter may be performed the same way as the selecting of the first typed parameter. The selection may thus be performed upon user interaction or automatically, as discussed previously for the selecting of the first typed parameter.

In an example, when the selecting of the second typed parameter is performed upon user interaction, the selecting may comprise detecting a second user interaction on a second logical area of the 2D manipulator; the second logical area of the 2D manipulator is different than the first logical area, that is the first and second logical areas do not intersect. The selecting selects the typed parameter associated with this second logical area. Two cases may occur: (i) if the second logical area is also associated with the first typed parameter, the second typed parameter may correspond to the first typed parameter; (ii) if the second logical area is not associated with the first typed parameter, the second typed parameter may be different than the first typed parameter.

In an example, when the selecting of the second typed parameter is automatically performed, the selecting of the second typed parameter may be performed automatically. For instance, one of the typed parameters may be registered as a default typed parameter after that the first parameter is set, and in that case the second typed parameter may be selected automatically immediately after that the first parameter is set. The method defines the selected second typed parameter as the current selected typed parameter. This means that the current selected typed parameter is no longer the first typed parameter and that the first typed parameter is replaced with the second typed parameter (obviously except when the second typed parameter is identical to the first typed parameter). For instance, in the memory, the method may remove a pointing from the memory address of the current selected typed parameter to the memory address of the first typed parameter and replace it with a new pointing from the memory address of the current selected typed parameter to the memory address of the second typed parameter.

In examples, the first typed parameter may remain selected after the selecting of the second typed parameter. In that case, the method may then set two typed parameters upon user interaction at the same time (i.e., the first and the second typed parameters together). Two typed parameters may thus be defined as current selected typed parameter, and the method may set these two typed parameters together upon user interaction. In other examples, the selection of the second typed parameter may comprise deselecting the first typed parameter. In that case, the method may then only set the second typed parameter upon user interaction.

In examples, the method may further comprise displaying a new graphical representation of the 2D manipulator in the 3D scene for setting the current selected typed parameter. The displaying of the new graphical representation may comprise displaying a new circular element belonging to the 2D surface of the logical area associated with the second typed parameter. When a circular element belonging to the 2D surface of the logical area associated with the second typed parameter is already displayed, the displaying of the new graphical representation may comprise updating the display of the circular element to highlight it (e.g., displaying the circular element with a thicker line). The displaying of the new graphical representation may also comprise hiding (partially or completely) the circular element belonging to the logical area associated with the first typed parameter.

In examples, the method may further comprise, after the selection of the second typed parameter, setting the current selected typed parameter (i.e., the second typed parameter) upon user interaction with the at least one logical area of the 2D manipulator associated with the current selected typed parameter. This means that the setting of the current selected typed parameter is repeated, but that the current selected typed parameter is now the second typed parameter. The setting of the second typed parameter may be analogue to the setting of the first typed parameter. For instance, the user interaction may be a press and release interaction (as previously discussed for the setting of the first typed parameter). As for the first typed parameter, a same user interaction may be performed for the selecting of the second typed parameter and the setting of this parameter. In examples also, the user interaction may be repeated, and a new value of the given typed parameter may be set after each user interaction.

In examples, the method may repeat these steps of selecting a new typed parameter, displaying a new graphical representation and setting the new typed parameter for a third typed parameter, a fourth typed parameter, etc. It is understood that the numeral expressions "first", "second", "third" or "fourth" are relative to the order in which the typed parameters are selected and do not necessarily designate different typed parameters. For instance, after the setting of a second typed parameter, the user may return to the first typed parameter and again set this first typed parameter. In that case, the first typed parameter may be also referred to as the "third" typed parameter (the one that is set after that the "second").

In examples, the selecting of a point of interest may be performed upon user interaction. For instance, the selecting of the point of interest may comprise detecting a user interaction on a geometry of the 3D modeled object and selecting a point of the geometry as the point of interest. In an example, if the geometry on which the user interaction is detected is a vertex, the method may comprise selecting the vertex as the point of interest. In another example, if the geometry on which the user interaction is detected is an edge, the method may comprise selecting a barycenter of the edge as the point of interest.

In examples, the displaying of the graphical representation may further comprise displaying a current value of the current selected typed parameter (e.g., substantially centered in the graphical representation of the 2D manipulator). This means that the current value of the first typed parameter, or of the second typed parameter (or of any subsequent typed parameter that is selected), may be displayed in the center of the graphical representation. For instance, the display of the current value may comprise a numerical value of the current selected typed parameter and a unit of the numerical value (which may, e.g., be displayed above the numerical value). The displaying of the graphical representation further comprises updating in real-time the displayed current value while setting of the current selected typed parameter. In real-time means that any change of the current value of the current selected typed parameter during the setting may immediately cause an update of the displayed current value. For instance, the method may, during the setting (e.g., during the movement of the press and release interaction), continuously detect the change of the current value (e.g., the change that is caused by the movement of the press and release interaction), and, when the change is higher than a threshold, update the displayed current value by computing a new current value by adding the detected change to the current value and displaying the computed new current value. The threshold may be small enough to make the update of the current value continuous to the user. In examples, the time may be discretized in time steps, and, for each time step, the updating may comprise computing a new value according to the user interaction during the previous time step and displaying the computed new value.

In examples, the displaying of the graphical representation may further comprise displaying a link that graphically connects the graphical representation of the 2D manipulator and the point of interest. The graphical representation discussed here may be the graphical representation that is displayed first (i.e., at the time of the setting of the first typed parameter) or alternatively may be the new graphical representation that is displayed after (i.e., at the time of the setting of the second typed parameter or any other subsequent typed parameter). The link graphically connects the graphical representation of the 2D manipulator and the point of interest. For instance, one end of the link is located near (or on) the boundary of the graphical representation and that the other end of the link is located near (or on) the point of interest. The link may not be permanently displayed. For instance, the link may be displayed only when the current selected typed parameter is set (and withdraws before and after the setting). The link improves the graphical rendering and understanding of the changes in the typed operation for the user, which increases productivity and efficiency.

In examples, the setting of the current selected typed parameter may comprises detecting a user interaction on one of logical area associated with the current selected typed parameter and determining a new value of the current selected typed parameter based on the value of the current selected typed parameter and the detected user interaction. For instance, the user interaction may be the press and release interaction previously discussed. The method may further comprise applying the typed operation to the 3D modeled object based on the new value of the current selected typed parameter This means that the modification that the application of the typed operation is computed according to the values of each of the typed parameter (i.e., including the new value for the current selected typed parameter). As previously discussed, a typed operation is an operation that, when instantiated, is entirely defined by the value of each of its typed parameters. This means that the computed modification is unique. After the computing, the method may comprise updating the representation of the 3D modeled object based on the applied typed operation. The updating may comprise displaying a new graphical representation that represents the 3D modeled object as geometrical modified by the modification induced by the application of the typed operation. For instance, if the typed operation is an extrusion, the updating may comprise displaying the extruded portion. Successively or at the same time, the method may further comprise updating a position of the 2D manipulator according to the updated representation of the 3D modeled object. For instance, if the location of the point of interest is modified by the application of the typed operation, and the graphical representation of the 2D manipulator is graphically linked to the point of interest, the 2D manipulator may be translated according to the modification of the location of the point of interest, e.g., such that the distance between the graphical representation and the point of interest remains graphically constant before and after the application of the typed operation (i.e., the dimension of the link may remain constant). The updating comprises an update of the respective position of each logical area of the 2D manipulator.

In examples, the updating of the position of the 2D manipulator may comprises keeping the 2D manipulator in a plane substantially perpendicular to a point of view of the user on the 3D scene. For instance, each 2D surface of the 2D manipulator may be substantially coplanar, and may remain coplanar after the update. Before and after the update, each 2D surface may thus remain on a same plane, which may be the plane of a device displaying the GUI or a plan perpendicular to the point of view of the user on the 3D scene. The point of view of the user is the one with which the representation of the 3D modeled object is displayed in the 3D scene (e.g., in the GUI). For instance, if the representation is displayed on a screen, the point of view is in a direction that is orthogonal to the plane of the screen. Alternatively or additionally, the updating of the position of the 2D manipulator may comprise keeping constant a distance in the 3D scene between the 2D manipulator and the point of interest. For instance, the dimension of the link graphically connecting the graphical representation of the 2D manipulator, and the point of interest may remain constant before and after the application of the typed operation.

In examples, the 2D manipulator may further comprises, for at least one of the at least two typed parameters, at least one additional logical area. This means that each typed parameter (e.g., all the typed parameters or one or more of the typed parameters) may be associated to one additional logical area, but may also be associated to several additional logical areas. For instance, the 2D manipulator may comprise one respective additional logical area for one or more of the typed parameters (e.g., for all of the at least two typed parameters). Each additional logical area is a respective 2D surface embedded in the 3D scene. Embedded in the 3D scene means that each additional logical area may be defined according to one or more features of the 3D scene. It also means that the 2D surface may move according to the view on the 3D scene. For instance, an additional logical area may be inside (e.g., may cover) the 3D modeled object (or alternatively be outside of the 3D modeled object). The 2D surface may change according to modifications of view of the 3D modeled object in the 3D scene, e.g., according to a modification induced by a change of point of view of the displayed 3D modeled object or a modification induced by the application of the typed operation to the 3D modeled object.

Each additional logical area may operate in an equivalent manner to a logical area. For instance, the user may perform a user interaction on each additional logical area for setting the associated typed parameter. The setting of the current selected typed parameter may comprise setting the current selected typed parameter upon user interaction with the at least one additional logical area of the 2D manipulator associated with the current selected typed parameters. The user interaction may be similar to the user interaction with one of the other logical areas and, for instance, may be a press and release interaction as discussed previously. Additional logical areas allow reducing the effort of the user interaction for setting a typed parameter, which improves ergonomics and efficiency. Indeed, the user may set the typed parameter remotely from the manipulator via the additional logical areas embedded in the 3D scene.

FIGS. 6 to 9 show four examples of graphical representations (610, 620, 630, 640) of the 2D manipulator. In these examples, the 3D modeled object 611 comprises an edge 612 and the typed operation is an edition. The 2D manipulator comprises two typed parameters which are the number of cuts of the edge 612 and the length of the 3D modeled object 611 in a direction perpendicular to the edge 612. The point of interest 613 is the barycenter of the edge 612. In each of the four examples of graphical representation, a link 614 is displayed. The link 614 graphically connects the point of interest 613 with the graphical representation.

Figure 6:
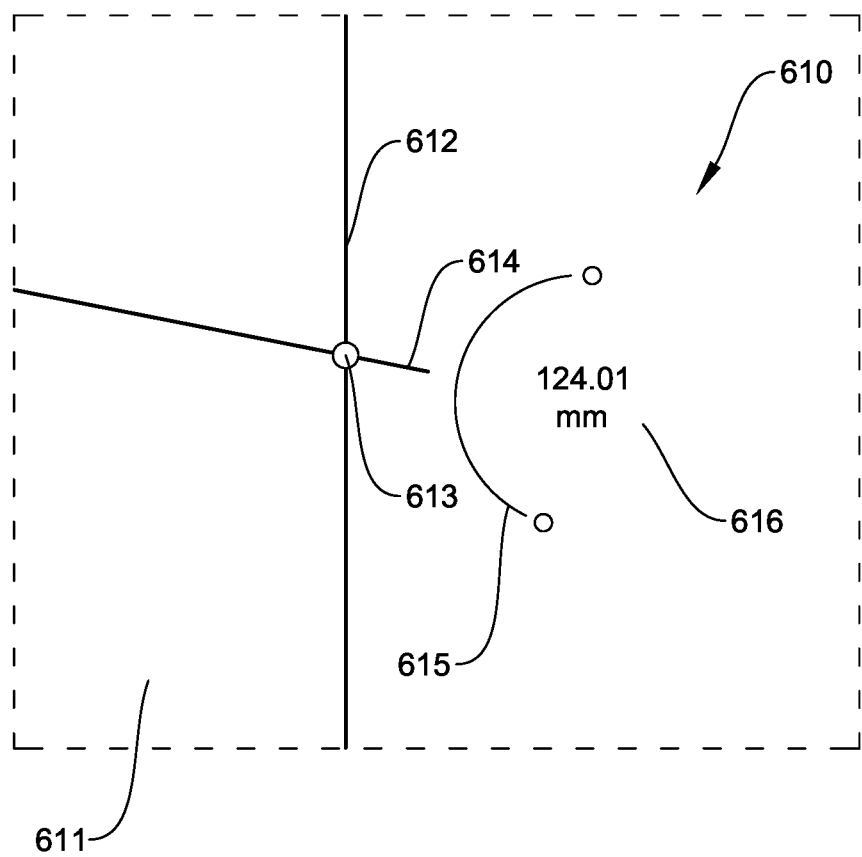
FIGS. 6, 7, 8 and 9 show four examples of graphical representations of the 2D manipulator

In the first example 610 of FIG. 6, the displayed graphical representation 610 comprises a first circular element 615. The first circular element 615 belongs to the 2D surface of the first typed parameter (which is in this example the length of the 3D modeled object 615 in a direction perpendicular to the edge 612). Thus, when a user interaction is detected on the 2D surface of the first typed parameter (i.e., near the first circular element 615, for example at a distance from the first circular element 615 lower than a threshold distance), the method sets the first typed parameter according to the detected user interaction. In this example, the first circular element 615 is a circle that is partially hidden (more than half of the circle is hidden). The current value of the first typed parameter is displayed in the center of the 2D manipulator 616. The display of the current value comprises a numerical value of the typed parameter "124.01" and, above the numerical value, the unit of the numerical value "mm".

Figure 7:
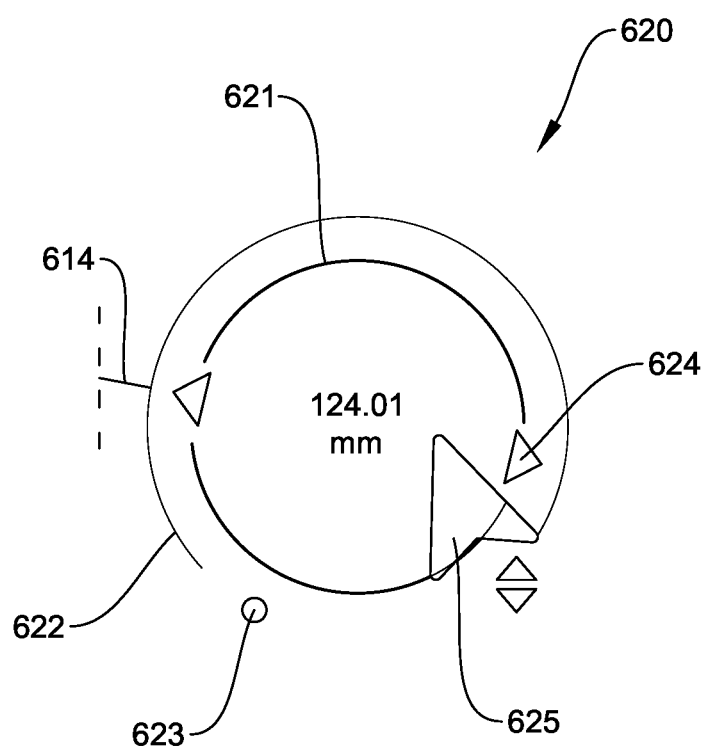

In the second example 620 of FIG. 7, the displayed graphical representation 620 comprises a second circular element 622, which belongs to the 2D surface of the second typed parameter (i.e., the number of cuts of the edge 612). The second circular element 622 is partially hidden and comprises a cursor 623 which indicates the current value of the second typed parameter (i.e., the current number of cuts of the edge 612). The first circular element 621 also differs from the one in the first example 610. The first circular element 621 comprises a circle and two cursors 624 on the circle, at opposite sides of the circle. The circle is partially hidden at each cursor to highlight them. The cursor 625 is inside the logical area associated with the first typed parameter. The current value of the first typed parameter is thus displayed in the center of the 2D manipulator.

Figure 8:
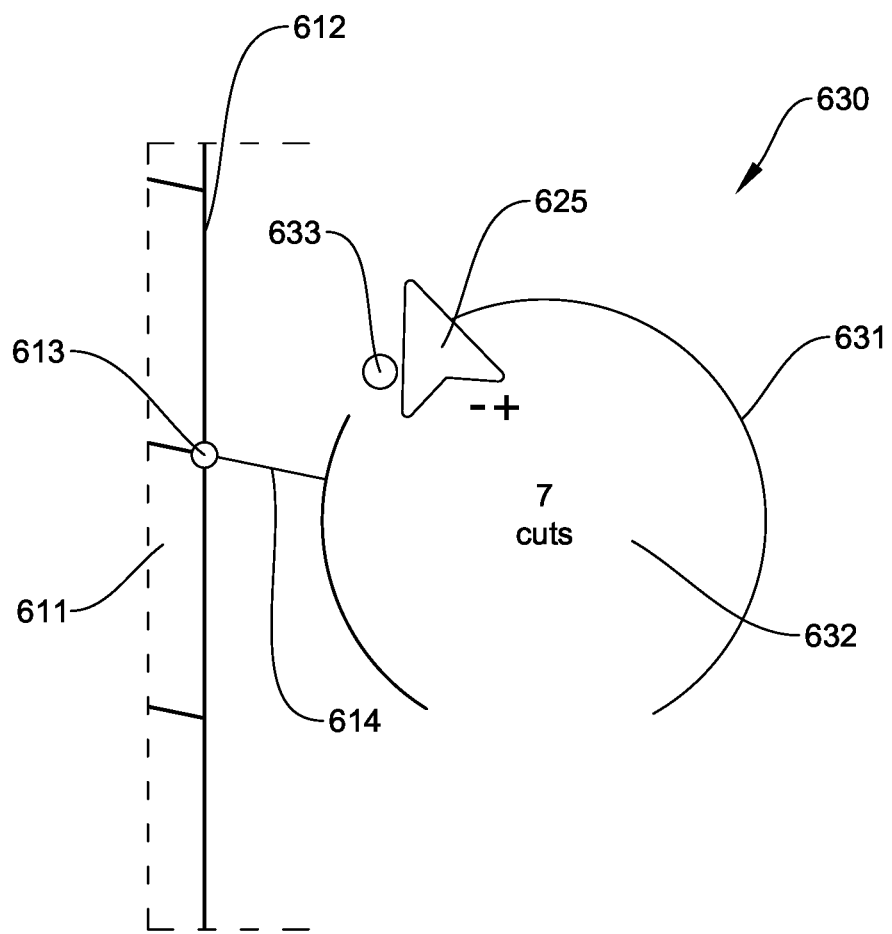

In the third example 630 of FIG. 8, the displayed graphical representation 630 comprises only the second circular element 631. The cursor 625 is inside the logical area associated with the second typed parameter (i.e., the number of cuts of the edge 612). The current value of the second typed parameter is thus displayed in the center of the 2D manipulator ("7 cuts"). A user interaction has been performed for setting the number of cuts of the edge 612, and the method has computed a new position for the cursor 633. The display of the second circular element 631 is different than in the second example 620, and the circle is highlighted (the thickness of the line of the circle is higher). The circular element 621 of the first typed parameter has been hidden.

Figure 9:
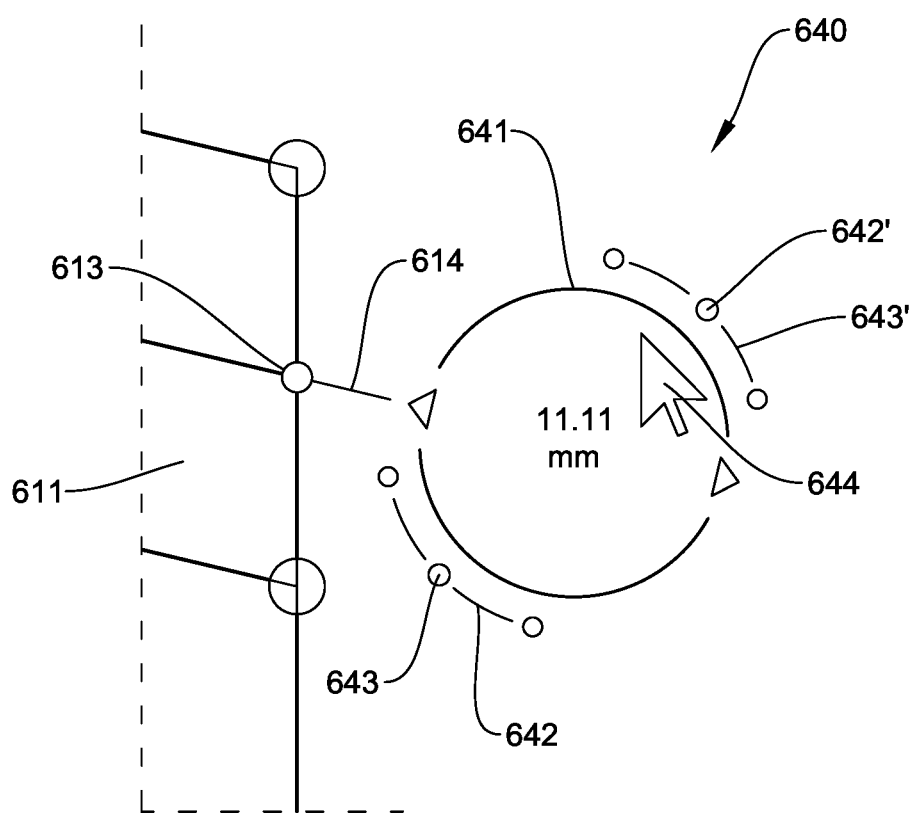

In the fourth example 640 of FIG. 9, the display of the graphical representation comprises a first circular element 641 and a second circular element. The display of the first circular element 641 is similar to the display in the second example 620. The display of the second circular element is different. The second circular element comprises two portions 642, 642' of circle, and each portion comprises a respective cursor 643, 643'. The cursor 644 is inside the logical area associated with the first typed parameter, and the current value of the first typed parameter is thus displayed in the center of the 2D manipulator ("11.11 mm").

Figure 10:
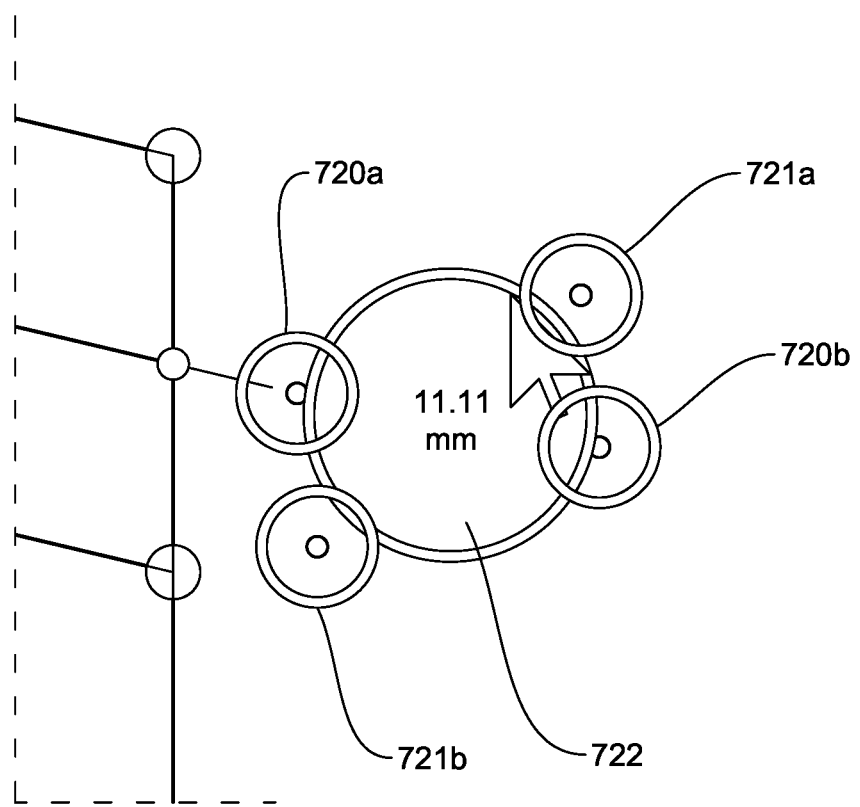
FIG. 10 shows an example of logical areas of the 2D manipulator.

FIG. 10 shows an example of logical areas of the 2D manipulator. The 2D manipulator comprises two logical areas 720a, 720b associated with the first typed parameter and two logical areas 721a, 721b associated with the second typed parameter. The user may set the first typed parameter by interacting with the two logical areas 720a, 720b and the second typed parameter by interacting with the two logical areas 721a, 721b. The 2D manipulator also comprises a main logical area 722. The main logical area 722 differs from the other 720a, 720b, 721, 721b in that the main logical area 722 is associated with the current selected parameter (i.e., alternatively with the first typed parameter or the second typed parameter depending on which is currently selected). The user may set the current selected typed parameter by interacting with the main logical area 722. Each logical area is a 2D surface delimited by a circle (i.e., is a geometrical disk) and the logical areas are coplanar one of each other. This means that they all belong to a same plan, which is in this example the screen plane on which the graphic representation and the 3D modeled object are displayed. Each logical area is centered on a respective geometrical element of the graphical representation of the 2D manipulator. The logical areas 720, 720', 721 and 721' are centered on a respective cursor of the first or second circular element that the graphical representation of the 2D manipulator comprises, and the main logical area is centered on the graphical representation.

Figure 11:
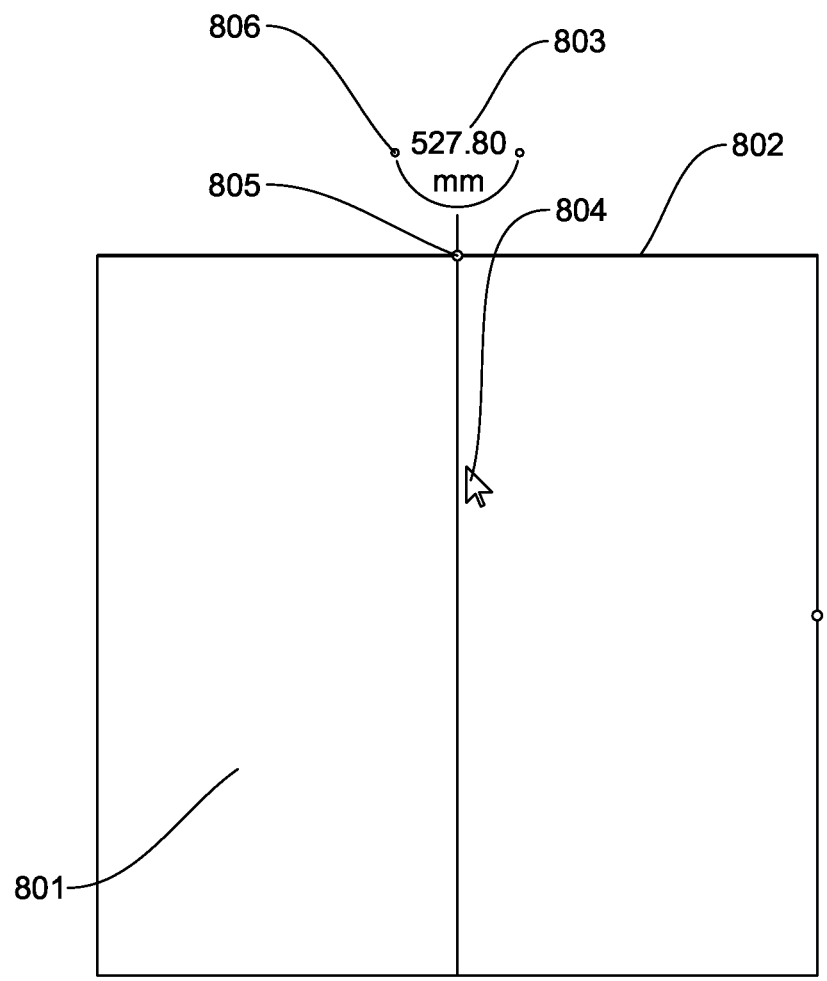
FIGS. 11, 12 and 13 illustrate an example of setting of a typed parameter with the 2D manipulator.
Figure 12:
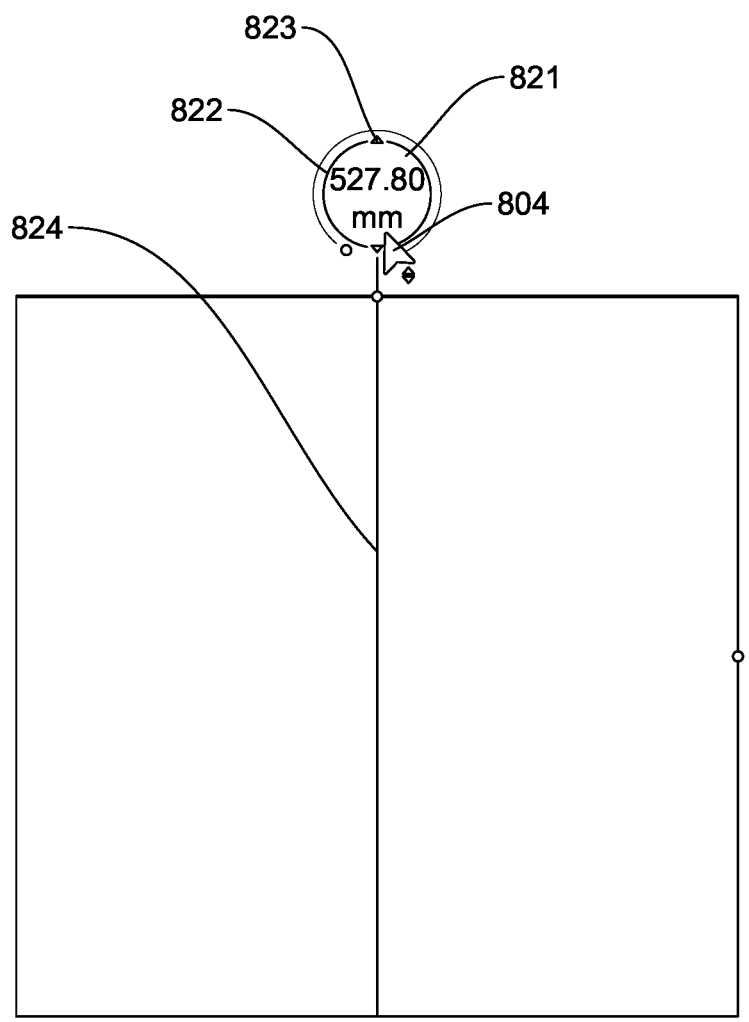
Figure 13:
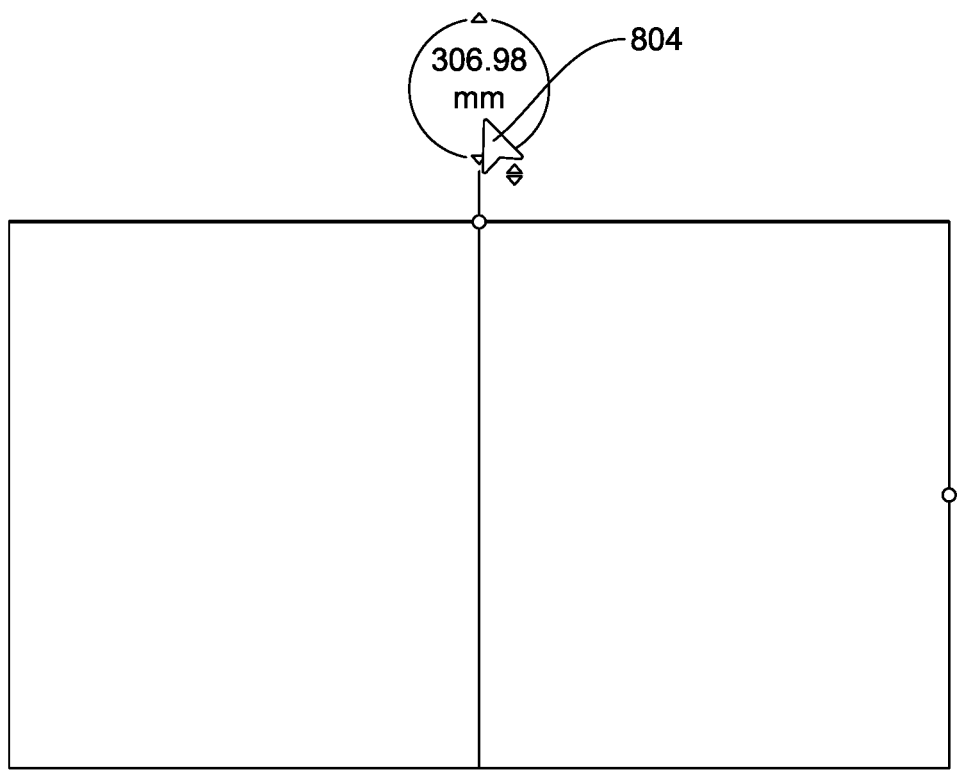
Figure 14:
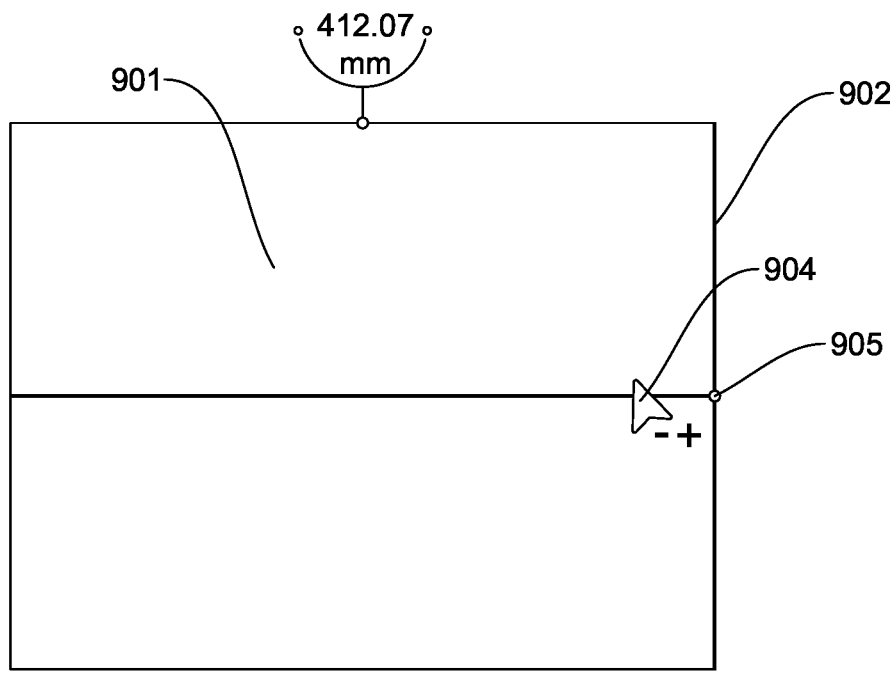
FIGS. 14, 15, 16, 17 and 18 illustrate an example of setting of two typed parameters of an edition operation with the 2D manipulator.

FIGS. 11 to 13 illustrate an example of setting of a typed parameter with the 2D manipulator. The 3D modeled object is a 3D patch 801 and comprises an edge 802. The method comprises obtaining the typed operation to be applied on the point of interest of the 3D patch. The obtaining of the typed operation may be performed automatically. For instance, in a previous step, the user has selected the edge 802 and the obtaining of the typed operation may comprise automatically determining that the point of interest 805 is the barycenter of the edge 802 and that the typed operation is an edition. In a first step illustrated in FIG. 11, the 2D manipulator is provided and the graphical representation 803 of the 2D manipulator is displayed. The 2D manipulator comprises a logical area for each of the two typed parameters. The two typed parameters are the number of cuts of the edge 802 and the length of the 3D patch 801 in a direction perpendicular to the edge 802. In the first step 810, the cursor 804 is outside of the logical area.

In a second step 820 illustrated in FIG. 12 and following the first step, the user approaches the cursor 804 of the 2D manipulator and places the cursor 804 inside the logical area associated with a first typed parameter, which is the length of the 3D patch 801 in this example. When the method detects that the cursor 804 is inside the logical area, the method displays a new graphical representation 821 of the 2D manipulator. The displaying comprises replacing the half-hidden circle 806 of the previous graphical representation with a full circle 822. The displaying also comprises displaying two cursors 823 on the full circle 822 that indicate the direction of modification of the typed parameter (i.e., the direction perpendicular to the edge 802). The method comprises displaying a line 824 representing a set of possible positions of the point of interest. Each possible position corresponds to a value of the length of the 3D patch 801.

In a third step illustrated in FIG. 13 and following the second step, a user interaction is performed by the user. The user interaction begins with a press inside the logical area associated with the first typed parameter. The method detects the press and selects the first typed parameter and defines the first typed parameter as the current selected typed parameter). Then, the user interaction comprises a movement of the cursor 804 and the method sets the first typed parameter according to the movement. The movement of the cursor 804 is directed to the 3D patch and the method computes a new value for the length of the 3D patch 801 according to the movement. The method applies the edition operation according to the new value computed (i.e., computes the length reduction) and updates the representation of the displayed 3D modeled objection. The method also updates the position of the 2D manipulator, and the value of the length displayed in the center of the 2D manipulator ("527.80 mm" is replaced with "306.98 mm"). The new position of the 2D manipulator is such that the 2D manipulator remains in a same plane which is perpendicular to the point of view of the user on the 3D scene and at a same distance from the point of interest 805. The method translates the 2D manipulator according to the translation of the point of interest 805 during the application of the typed operation.

FIGS. 14 to 18 illustrate an example of setting of two typed parameters of an edition operation with the 2D manipulator. The 3D modeled object is a 3D patch 901 and comprises an edge 902. In a first step illustrated in FIG. 14, the method obtains the typed operation to be applied on the point of interest of the 3D patch. The obtaining of the typed operation comprises detecting that the cursor 904 approaches the edge 902 and determining that the point of interest 805 is the barycenter of the edge 802 and that the typed operation is an edition.

Figure 15:
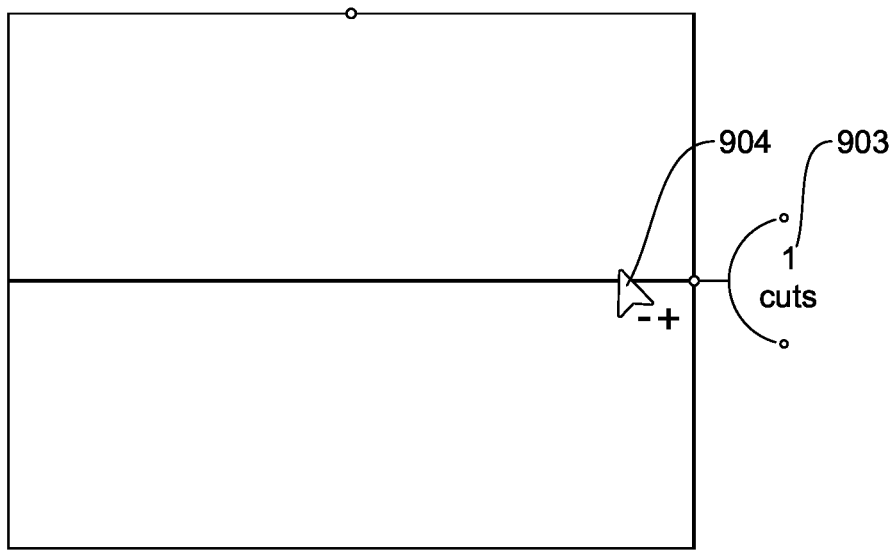

In a second step illustrated in FIG. 15 and following the first step, the 2D manipulator is provided. The 2D manipulator comprises a logical area for each of the two typed parameters. The two typed parameters are the number of cuts of the edge 902 and the length of the 3D patch 901 in a direction perpendicular to the edge 902. The 2D manipulator comprises an additional logical area for the second typed parameters (which is the number of cuts of the edge 902). The additional logical area is a 2D surface that covers the representation of the 3D patch 901 and the cursor 904 is inside the additional logical area. After the providing of the 2D manipulator, a user interaction is performed by the user and begins with a press inside the additional logical area associated with the second typed parameter. The method detects the press and selects the second typed parameter (and defines the second typed parameter as the current selected typed parameter). At this time, the method displays a graphical representation 903 of the 2D manipulator for setting the second typed parameter. The graphical representation 903 comprises a first circular element belonging to the 2D surface of the logical area of the 2D manipulator associated with the second typed parameter. The current value (i.e., the current number of cuts of the edge 902) is displayed in the center of the graphical representation 903.

Figure 16:
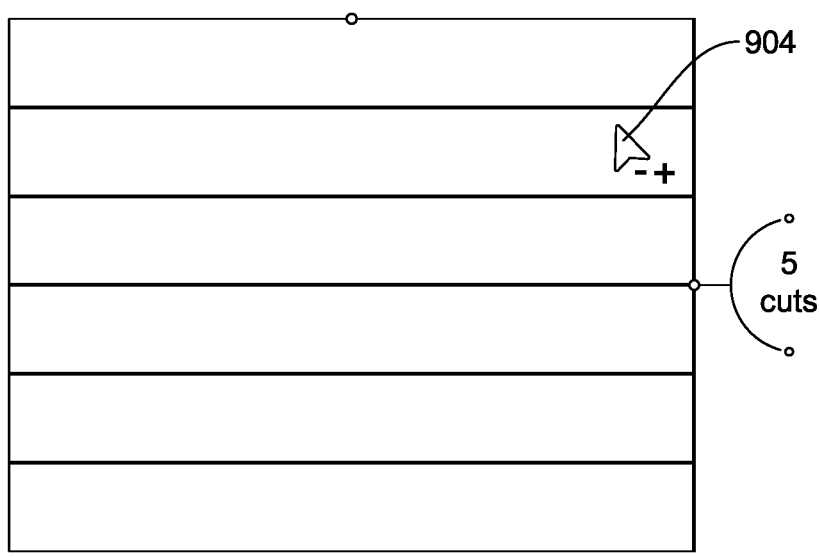

In a third step illustrated in FIG. 16 and following the second step, the user moves the cursor 904 and the method sets the second typed parameter (i.e., the number of cuts of the edge 902) according to the movement. The method applies the edition operation according to the new value computed (i.e., increases the number of cuts of the edge 902) and updates the representation of the displayed 3D modeled objection accordingly. The method also updates the value of the number of cuts displayed in the center of the 2D manipulator ("1 cuts" is replaced with "5 cuts").

Figure 17:
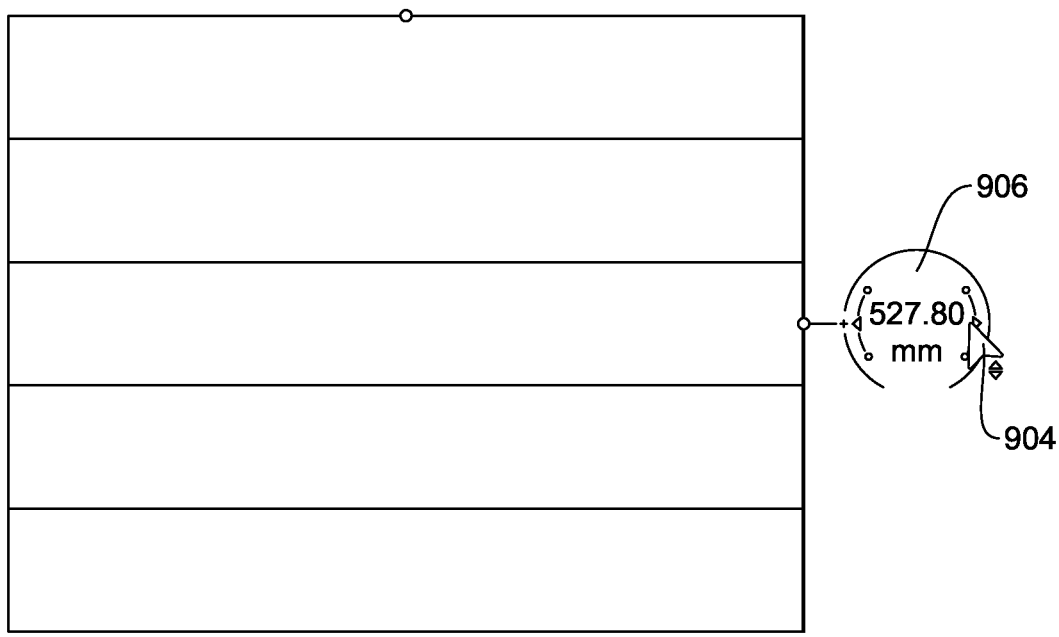

In a fourth step illustrated in FIG. 17 and following the third step, the user moves the cursor 904 inside the logical area associated with the first typed parameter (i.e., the length of the 3D patch 901 in a direction perpendicular to the edge 902). The method displays a new graphical representation 906 of the 2D manipulator. The new graphical representation 906 comprises a second circular element belonging to the 2D surface of the logical area of the 2D manipulator associated with the first typed parameters.

Figure 18:
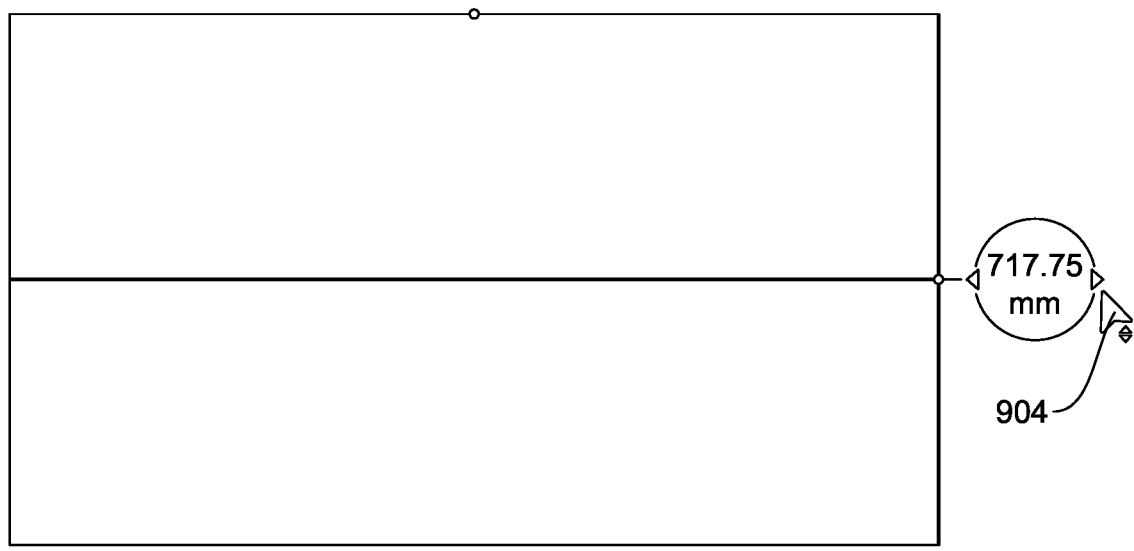
Figure 19:
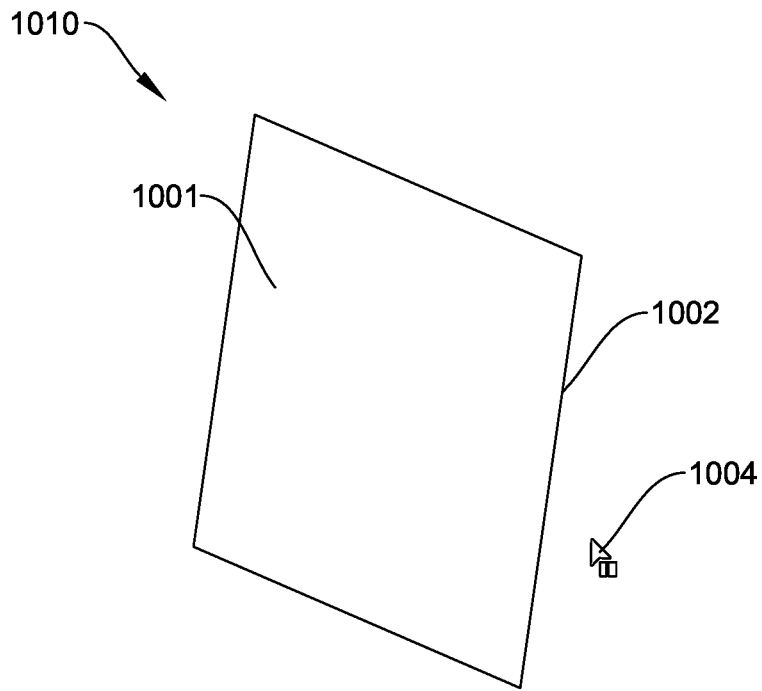
FIGS. 19, 20, 21 and 22 illustrate an example of setting of two typed parameters of an extrusion operation with the 2D manipulator.

In a fifth step illustrated in FIG. 18 and following the fourth step, the first typed parameter is set. For instance, the first typed parameter is set in a similar way as described in reference to FIGS. 11 to 13.

FIGS. 19 to 22 illustrate an example of setting of two typed parameters of an extrusion operation with the 2D manipulator. In this another example, the typed operation is an extrusion. The 3D modeled object is a 3D patch 1001 and comprises an edge 1002. In a first step illustrated in FIG. 19, the method obtains the typed operation to be applied on the point of interest of the 3D patch. The obtaining of the typed operation comprises detecting that the cursor 904 approaches the edge 1002 and determining that the typed operation is an extrusion. For instance, the extrusion is defined as a default typed operation or the user has previously selected that typed operation is an extrusion. The extrusion comprises a first typed parameter which is the length of extrusion and a second typed parameter which is the rotation of extrusion. The 2D manipulator is provided and comprises an additional logical area for the first typed parameters (which is the length of extrusion). The additional logical area is a 2D surface covering the outside of the representation of the 3D patch 1001. In the first step 1010, the cursor 1004 is thus inside the additional logical area.

Figure 20:
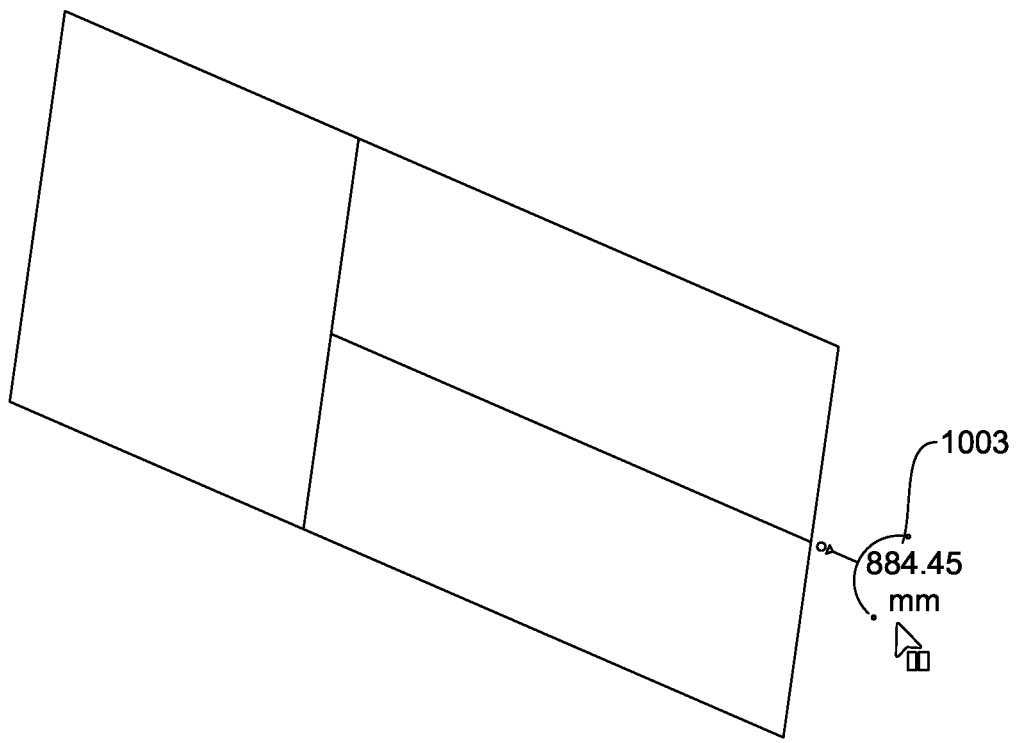

In a second step illustrated in FIG. 20 and following the first step, a user interaction is performed by the user and begins with a press inside the additional logical area associated with the first typed parameter (i.e., the length of extrusion). The method detects the press and selects the first typed parameter (and defines the first typed parameter as the current selected typed parameter). At this time, the method displays a graphical representation 1003 of the 2D manipulator for setting the second typed parameter. Then, the user moves the cursor 1004 and the method sets the length of extrusion according to the movement, applies the extrusion operation according to the new computed value (i.e., increases the length of extrusion) and updates the representation of the displayed 3D modeled objection accordingly. The method also updates the value of the number of cuts displayed in the center of the 2D manipulator ("884.45").

Figure 21:
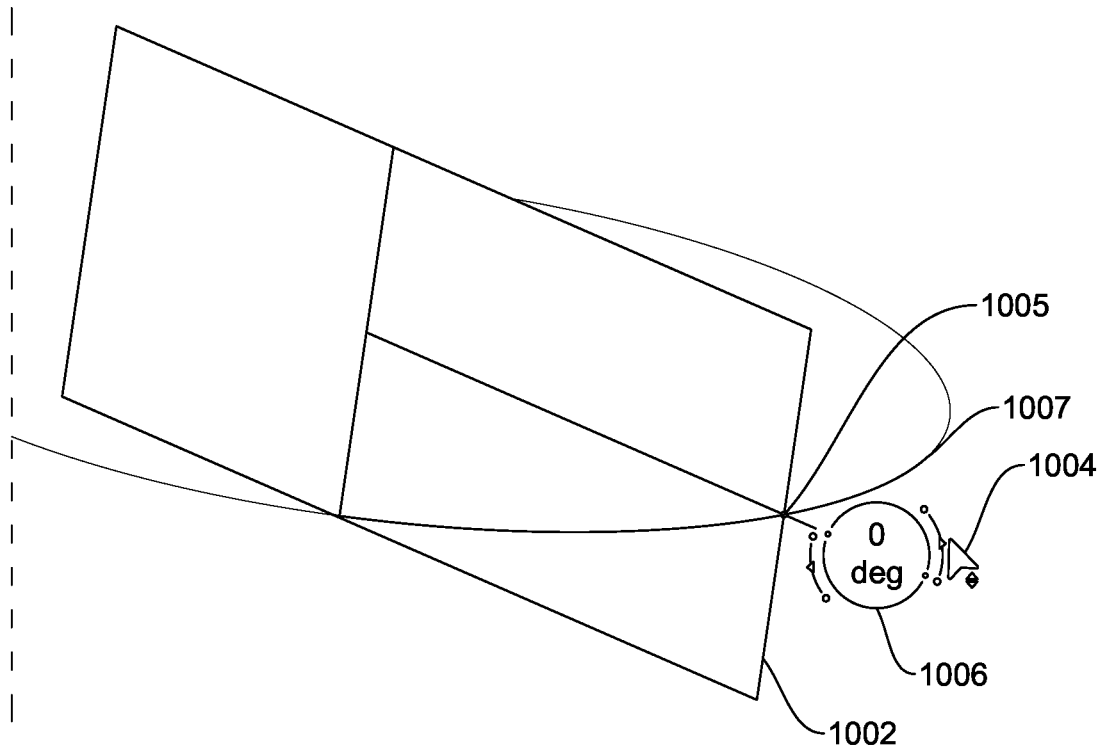

In a third step illustrated in FIG. 21 and following the second step, after the setting of the length of extrusion, the user moves the cursor 1004 inside the logical area associated with the second typed parameter (i.e., the rotation of extrusion). The method detects that the cursor 1004 is inside the logical area associated with the second typed parameter and displays a new graphical representation 1006 of the 2D manipulator. The new graphical representation 1006 comprises a second circular element belonging to the 2D surface of the logical area of the 2D manipulator associated with the second typed parameters. The new graphical representation 1006 also comprises two cursors that indicate the rotation direction. The method also displays a line 1007 representing a set of possible positions of the point of interest 1005. Each possible position of the set corresponds to a value of the current selected typed parameter. The line 1007 represents the set of possible positions of the point of interest 1005 when the edge 1002 is rotated, i.e., when the extrusion is applied to the 3D patch 1001 with different values of rotation. The line 1007 thus allows guiding the user when the setting of the rotation of extrusion is performed.

Figure 22:
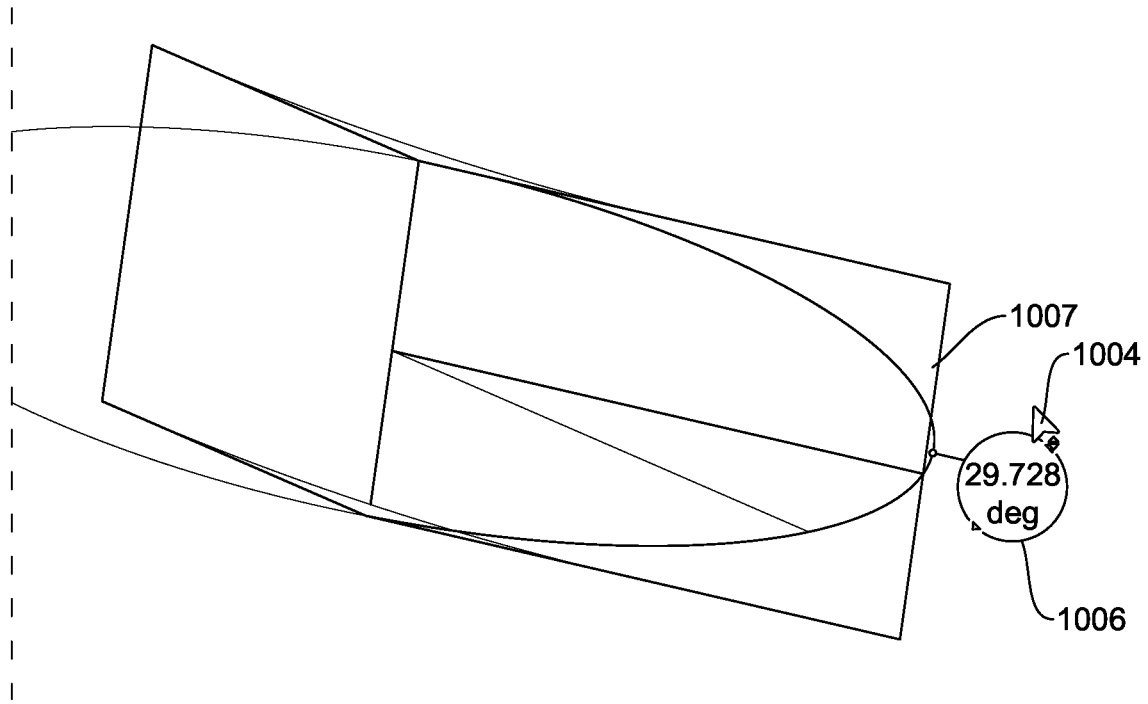

In a fourth step illustrated in FIG. 22 and following the third step, the rotation of extrusion is set. A press and release user interaction is performed by the user, which begins with a press inside the additional logical area associated with the second typed parameter (i.e., the rotation of extrusion). The method detects the press and selects the second typed parameter (and defines the second typed parameter as the current selected typed parameter). Thus, the method changes the current selected typed parameter (which was before the first typed parameter). At this time, the method modifies the displayed new graphical representation 1006 and highlights the displayed second circular element (e.g., with a higher thickness or with a different color). Similarly, the method also highlights the display of the line 1007. Then, the user moves the cursor 1004 and the method sets the rotation of extrusion according to the movement, applies the extrusion operation according to the new computed value (i.e., increases the rotation of extrusion) and updates the representation of the displayed 3D modeled objection accordingly. The method also updates the value of the number of cuts displayed in the center of the 2D manipulator ("29.728 deg").

The invention claimed is:

1. A computer-implemented method for setting a typed parameter of a typed operation applied to a 3D modeled object in a 3D scene, the method comprising:
    displaying a representation of the 3D modeled object in the 3D scene;
    obtaining the typed operation to be applied on a point of interest of the displayed representation of the 3D modeled object, the typed operation comprising at least two typed parameters, the at least two typed parameters being set successively in a same period of time to completely define the typed operation;
    selecting a first typed parameter among the at least two typed parameters, thereby defining the selected first typed parameter as a current selected typed parameter;
    applying a 2D manipulator in the 3D scene for setting the current selected typed parameter, the 2D manipulator including at least one logical area associated with each of the at least two typed parameters, a logical area being a 2D surface in the 3D scene on which a user interaction is performable for setting the typed parameter associated therewith;
    displaying a graphical representation of the 2D manipulator in the 3D scene for setting the current selected typed parameter; and
    setting the current selected typed parameter upon user interaction with the at least one logical area of the 2D manipulator associated with the current selected typed parameters.

2. The computer-implemented method of claim 1, the method further comprising:
    selecting a second typed parameter among the at least two typed parameters, thereby defining the selected second typed parameter as the current selected typed parameter;

displaying a new graphical representation of the 2D manipulator in the 3D scene for setting the current selected typed parameter; and setting the current selected typed parameter upon user interaction with the at least one logical area of the 2D manipulator associated with the current selected typed parameter.

3. The computer-implemented method of claim 2, wherein the graphical representation of the 2D manipulator includes a first circular element belonging to the 2D surface of the at least one logical area of the 2D manipulator associated with the second typed parameter.

4. The computer-implemented method of claim 3, wherein the graphical representation of the 2D manipulator includes a second circular element belonging to the 2D surface of the at least one logical area of the 2D manipulator associated with the selected first typed parameters, wherein the first and second circular elements are concentric one of each other's and have each a respective radius.

5. The computer-implemented method of claim 4, wherein:

at least one of the first and second circular elements is a slider; and/or at least one of the first and second circular elements comprises two triangles that orient themselves to indicate a direction of modification.

6. The computer-implemented method of claim 1, wherein the displaying of the graphical representation further comprises:

displaying a current value of the current selected typed parameter, the displayed current value being displayed substantially centered in the graphical representation of the 2D manipulator; and updating in real time the displayed current value while setting of the current selected typed parameter.

7. The computer-implemented method of claim 1, wherein the obtaining of the typed operation to be applied on the point of interest further comprises:

detecting a user interaction on a geometry of the 3D modeled object; and if the geometry on which the user interaction is detected is a vertex, selecting the vertex as the point of interest, or if the geometry on which the user interaction is detected is an edge, selecting a barycenter of the edge as the point of interest; and wherein the displaying the graphical representation further comprises displaying a link graphically connecting the graphical representation of the 2D manipulator and the point of interest.

8. The computer-implemented method of claim 1, wherein the setting of the current selected typed parameter further comprises:

detecting a user interaction on one of logical area associated with the current selected typed parameter;

determining a new value of the current selected typed parameter based on the value of the current selected typed parameter and the detected user interaction;

applying the typed operation to the 3D modeled object based on the new value of the current selected typed parameter; and updating the representation of the 3D modeled object based on the applied typed operation and updating a position of the 2D manipulator according to the updated representation of the 3D modeled object.

9. The computer-implemented method of claim 8, wherein the updating of the position of the 2D manipulator further comprises:

keeping the 2D manipulator in a plane perpendicular to a point of view of the user on the 3D scene; and/or keeping constant a distance in the 3D scene between the 2D manipulator and the point of interest.

10. The computer-implemented method of claim 1, wherein the setting of the current selected typed parameter includes displaying at least one line representing a set of possible positions of the point of interest, each possible position of the set corresponding to a value of the current selected typed parameter.

11. The computer-implemented method of claim 1, wherein the 2D manipulator further includes, for at least one of the at least two typed parameters, at least one additional logical area, each additional logical area being a respective 2D surface embedded in the 3D scene, and wherein the setting of the current selected typed parameter comprises setting the current selected typed parameter upon user interaction with the at least one additional logical area of the 2D manipulator associated with the current selected typed parameters.

12. The computer-implemented method of claim 1, wherein:

the typed operation is an edition, the 3D modeled object includes an edge, the at least two typed parameters include a number of cuts of the edge and a length of the 3D modeled object in a direction perpendicular to the edge;

the typed operation is an extrusion, the at least two typed parameters include a length of extrusion and a rotation of extrusion; or the typed operation is a pattern, the at least two typed parameters include a pattern design and a pattern density.

13. A non-transitory computer readable storage medium having recorded thereon a computer program including instructions that, when executed by a computer, cause the computer to perform a method for setting a typed parameter of a typed operation applied to a 3D modeled object in a 3D scene, the method comprising:

displaying a representation of the 3D modeled object in the 3D scene;

obtaining the typed operation to be applied on a point of interest of the displayed representation of the 3D modeled object, the typed operation comprising at least two typed parameters, the at least two typed parameters being set successively in a same period of time to completely define the typed operation;

selecting a first typed parameter among the at least two typed parameters, thereby defining the selected first typed parameter as a current selected typed parameter;

applying a 2D manipulator in the 3D scene for setting the current selected typed parameter, the 2D manipulator comprising at least one logical area associated with each of the at least two typed parameters, a logical area being a 2D surface in the 3D scene on which a user interaction is performable for setting the typed parameter associated therewith;

displaying a graphical representation of the 2D manipulator in the 3D scene for setting the current selected typed parameter; and setting the current selected typed parameter upon user interaction with the at least one logical area of the 2D manipulator associated with the current selected typed parameters.

14. The non-transitory computer readable storage medium of claim 13, wherein the method further comprises:
- selecting a second typed parameter among the at least two typed parameters, thereby defining the selected second typed parameter as the current selected typed parameter;
- displaying a new graphical representation of the 2D manipulator in the 3D scene for setting the current selected typed parameter; and
- setting the current selected typed parameter upon user interaction with the at least one logical area of the 2D manipulator associated with the current selected typed parameter.

15. The non-transitory computer readable storage medium of claim 14, wherein the graphical representation of the 2D manipulator includes a first circular element belonging to the 2D surface of the at least one logical area of the 2D manipulator associated with the second typed parameter.

16. The non-transitory computer readable storage medium of claim 15, wherein the graphical representation of the 2D manipulator includes a second circular element belonging to the 2D surface of the at least one logical area of the 2D manipulator associated with the selected first typed parameters, and
- wherein the first and second circular elements are concentric one of each other's and have each a respective radius.

17. A system comprising:
- a processor coupled to a memory, the memory having recorded thereon a computer program for setting a typed parameter of a typed operation applied to a 3D modeled object in a 3D scene that when executed by the processor causes the processor to be configured to:
- display a representation of the 3D modeled object in the 3D scene;
- obtaining the typed operation to be applied on a point of interest of the displayed representation of the 3D modeled object, the typed operation comprising at least two typed parameters, the at least two typed parameters being set successively in a same period of time to completely define the typed operation;
- select a first typed parameter among the at least two typed parameters, thereby defining the selected first typed parameter as a current selected typed parameter;
- obtain a 2D manipulator in the 3D scene for setting the current selected typed parameter, the 2D manipulator comprising at least one logical area associated with each of the at least two typed parameters, a logical area being a 2D surface in the 3D scene on which a user interaction is performable for setting the typed parameter associated therewith;
- display a graphical representation of the 2D manipulator in the 3D scene for setting the current selected typed parameter; and
- set the current selected typed parameter upon user interaction with the at least one logical area of the 2D manipulator associated with the current selected typed parameters.

18. The system of claim 17, wherein the processor is further configured to:
- select a second typed parameter among the at least two typed parameters, thereby defining the selected second typed parameter as the current selected typed parameter;
- display a new graphical representation of the 2D manipulator in the 3D scene for setting the current selected typed parameter; and
- set the current selected typed parameter upon user interaction with the at least one logical area of the 2D manipulator associated with the current selected typed parameter.

19. The system of claim 18, wherein the graphical representation of the 2D manipulator includes a first circular element belonging to the 2D surface of the at least one logical area of the 2D manipulator associated with the second typed parameter.

20. The system of claim 19, wherein the graphical representation of the 2D manipulator includes a second circular element belonging to the 2D surface of the at least one logical area of the 2D manipulator associated with the selected first typed parameters, and
- wherein the first and second circular elements are concentric one of each other's and have each a respective radius.

* * * * *